(12) United States Patent
Watanabe et al.

(10) Patent No.: US 6,295,241 B1
(45) Date of Patent: Sep. 25, 2001

(54) DYNAMIC RANDOM ACCESS MEMORY DEVICE

(75) Inventors: Shigeyoshi Watanabe, Kanagawa-ken; Tsuneaki Fuse; Koji Sakui, both of Tokyo; Masako Ohta, Kanagawa-ken; Yukihito Oowaki, Kanagawa-ken; Kenji Numata, Kanagawa-ken; Fujio Masuoka, Kanagawa-ken, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 08/251,649

(22) Filed: May 31, 1994

Related U.S. Application Data

(63) Continuation of application No. 08/126,135, filed on Sep. 23, 1993, now abandoned, which is a continuation of application No. 07/921,384, filed on Jul. 30, 1992, now abandoned, which is a continuation of application No. 07/780,389, filed on Oct. 23, 1991, now abandoned, which is a continuation of application No. 07/504,031, filed on Mar. 29, 1990, now abandoned, which is a continuation of application No. 07/206,746, filed on Jun. 15, 1988, now abandoned, which is a continuation-in-part of application No. 07/031,380, filed on Mar. 30, 1987, now abandoned.

(30) Foreign Application Priority Data

Jun. 15, 1987 (JP) .................................................. 62-148192
Dec. 28, 1987 (JP) .................................................. 62-329785

(51) Int. Cl.⁷ ........................................................ G11C 7/02
(52) U.S. Cl. ........................... 365/208; 365/207; 365/177
(58) Field of Search ................................... 365/149, 174, 365/177, 179, 180, 205, 207, 208, 190

(56) References Cited

U.S. PATENT DOCUMENTS

| | | | |
|---|---|---|---|
| 4,616,342 | * 10/1986 | Miyamoto et al. | 365/205 |
| 4,713,796 | * 12/1987 | Ogiue et al. | 365/177 |
| 4,777,625 | * 10/1988 | Sakui et al. | 365/227 |

FOREIGN PATENT DOCUMENTS 61-142594  6/1986  (JP) .
61-170992  8/1986  (JP) .

* cited by examiner

*Primary Examiner*—A. Zarabian
(74) *Attorney, Agent, or Firm*—Foley & Lardner

(57) ABSTRACT

Here is disclosed a dynamic semiconductor memory of high integration density, which has parallel word lines and parallel bit lines formed on a substrate. The bit lines include a pair of bit lines. A memory cell is coupled to a word line and to one bit line of the bit-line pair. The memory cell is composed of MOSFETs of a submicron size. A sense amplifier section is connected to the pair of bit lines, and senses and amplifies the potential difference between the pair of bit lines in a data readout mode. The amplifier section has a BIMOS structure, having MOSFETs and bipolar transistors. It has a driver section comprised of bipolar transistors.

15 Claims, 20 Drawing Sheets

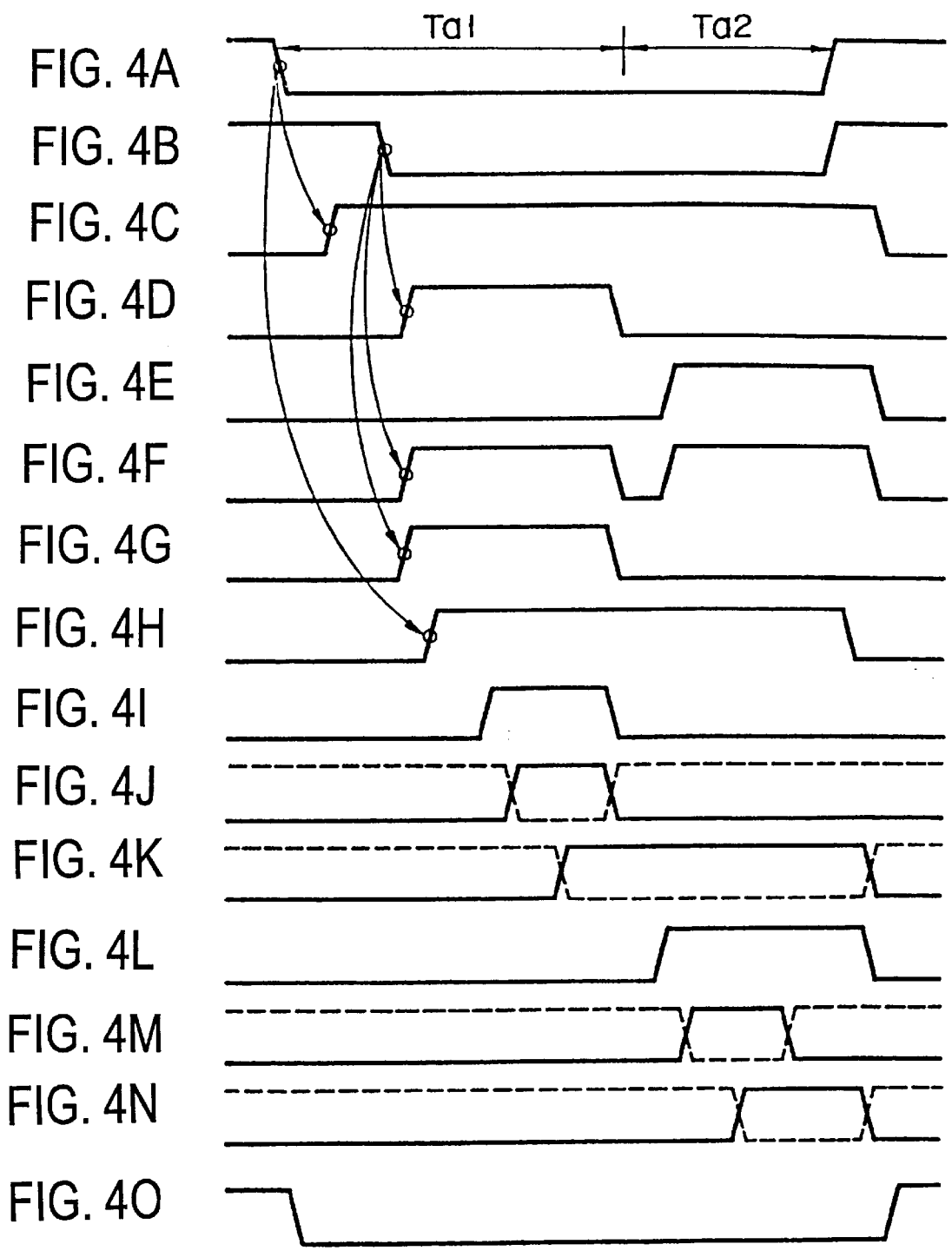

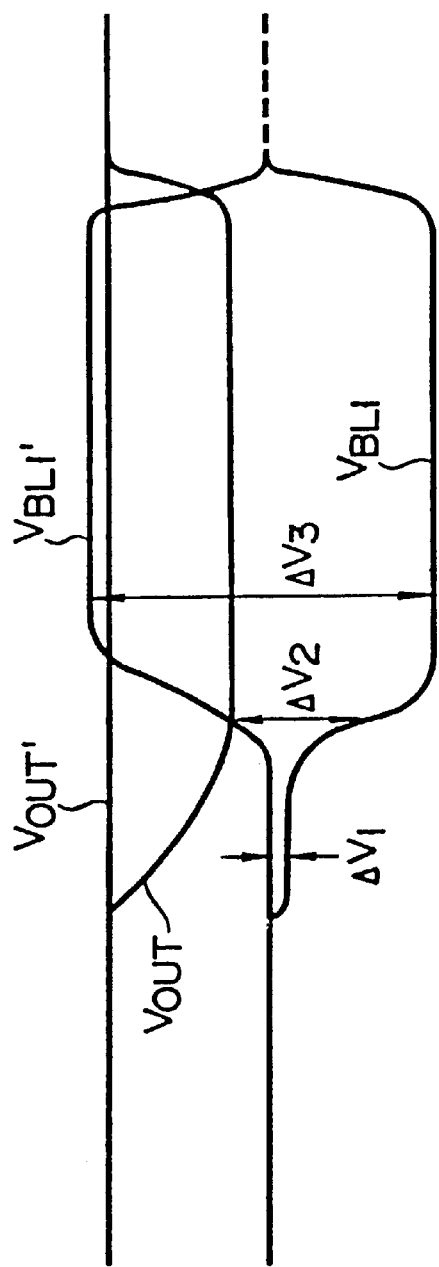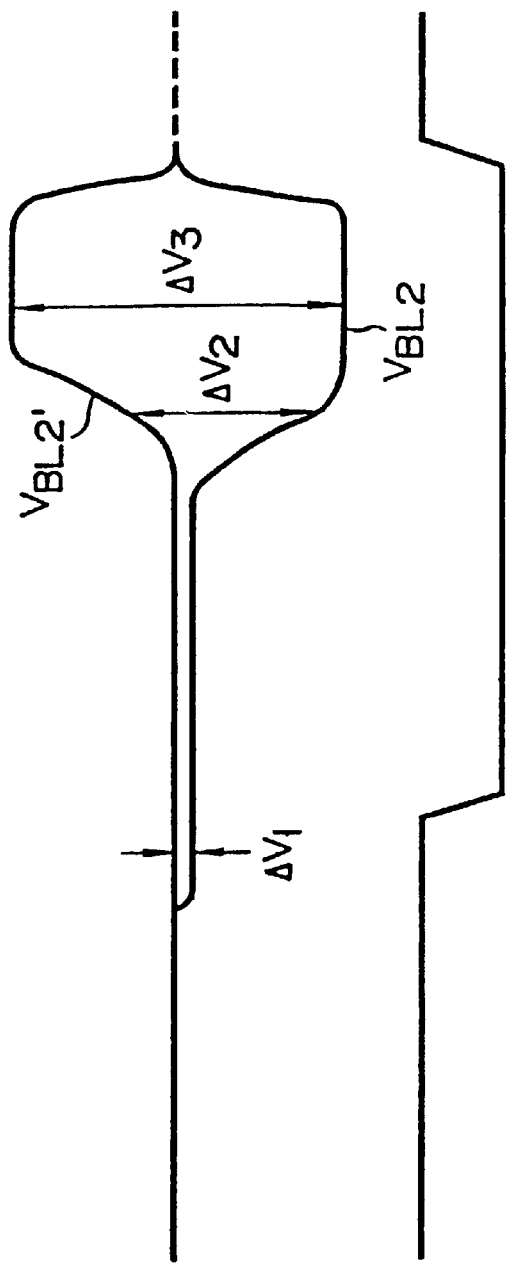
FIG. 5A  FIG. 5B  FIG. 5C

DYNAMIC RANDOM ACCESS MEMORY DEVICE

CROSS REFERENCE TO RELATED APPLICATION

This application is a continuation of application Ser. No. 08/126,135, filed on Sept. 23, 1993, abandoned, which is a continuation of Ser. No. 07/921,384, filed Jul. 30, 1992, abandoned, which is a continuation of Ser. No. 07/780,389 filed Oct. 23, 1991, abandoned, which is a continuation of Ser. No. 07/504,031 filed Mar. 29, 1990, abandoned, which is a continuation of Ser. No. 07/206,746 filed Jun. 15, 1988, abandoned, which is a continuation-in-part of Ser. No. 07/031,380 filed Mar. 30, 1987, abandoned.

BACKGROUND OF THE INVENTION

The present invention relates to a semiconductor memory device, and more particularly, to a dynamic random-access memory using metal oxide semiconductor field-effect transistors (MOSFETs).

In the recent years, dynamic random-access memories (hereinafter referred to as "dRAMs") have been improved to have a greater memory capacity and to operate at a higher speed. In order to provide this memory capacity, a micro-fabrication technique is required to make the memory cells as small as possible. Now, dRAMs are being developed in which the transistors used as memory cells have a "submicron" size and which, therefore, have an extremely high integration density. Each of these dRAMs includes a sense amplifier for sensing the level difference between the signal read from a memory cell and the signal read from a dummy cell. The sense amplifier is also composed of MOSFETs having a submicron size. More specifically, these micro-fabricated MOSFETs have a gate length of 0.5 micrometers or less. The shorter the gate length, the more intense the inner electric field of a MOSFET. Hence, the bias voltage for the MOSFET must be lowered to render the MOSFET sufficiently reliable. This is because, when the inner electric field of the MOSFET becomes intense, over-coming the source-drain withstand voltage which is specific to transistors made of a particular material, the probability of malfunction or the probability of breakdown greatly rises. However, when the bias voltage is lowered, the switching speed of the MOSFET is proportionally reduced, thus decreasing the data-reading speed of the dRAM. Therefore, it would be difficult to provide a great-capacity, high-speed dRAM even if the size of the memory cells were simply reduced to the submicron order.

In order to make a dRAM operate at high speed, bipolar transistors can be used for memory cells. Bipolar transistors have, by nature, a great current driving ability. A dRAM whose memory cells use bipolar transistors is able to operate at high speed. As is well known in the art, however, bipolar transistors cannot be micro-fabricated, and can scarcely serve to provide a memory with a great memory capacity. Consequently, it would also be difficult to provide a great-capacity, and yet high-speed dRAM when bipolar transistors were used for memory cells.

The present invention further relates to dynamic random access memory devices, and more particularly to dynamic random access memory devices performing high speed and high integration with bit-line sense amplifiers comprising MOS transistors and Bipolar transistors.

As discussed above, the degree of integration of dynamic random access memories (DRAM) has been advancing with an advancement of micro-fabrication techniques. In conjunction with this, the efficiency of the elements has improved, and thereby the access time of the DRAMs has become shorter.

However, when the gate length is decreased to about 0.5 μm or below, it will be necessary to reduce the supply voltage in order to maintain reliability of the elements. Therefore, it will become more difficult to achieve higher speeds.

A proposal was made to introduce bipolar transistors as a part of the DRAM because they have a larger current carrying ability compared to MOS transistors, and therefore can achieve higher speeds. For example, a differential amplifier has been suggested including bipolar transistors as its drivers. Such a circuit configuration incorporating bipolar transistors into a MOS circuit is called a BIMOS circuit. However, the area dominated with BIMOS sense amplifier becomes large as compared with one constructed only by MOS transistors. Therefore, a design in which one BIMOS sense amplifier is connected to a plurality of bit-line pairs is preferable. (Japanese Patent Disclosure (Kokai) No. 61-142594)

DRAM memory cells consist of one transistor/one capacitor, and need re-writing or restoring after reading out, because the DRAM uses a destructive type read out. Conventionally, the restoring was carried out together with the information sensing of the memory cells, using a CMOS flip-flop as a bit-line sense amplifier. In order to read out the information of the memory cells at high speed, it is preferable to activate the BIMOS sense amplifier before activating this CMOS flip-flop. However, if the bit-line directly connects to the base of the bipolar transistor, which is the driver of the BIMOS sense amplifier, the information in the memory cell is destroyed. This is because the signal charge in the memory cell transferred to the bit line is used as a base current. Thereby, a buffer circuit with high input impedance is disposed between the BIMOS differential amplifier and a bit-line pair.

SUMMARY OF THE INVENTION

It is accordingly the object of the invention to provide a novel and improved dynamic semiconductor memory device which has a high integration density and which can operate at high speed.

In order to accomplish the above object, the present invention is addressed to a specific semiconductor memory device which includes parallel word lines formed on a substrate, and parallel bit lines also formed on the substrate. The bit lines cross with the word lines and are electrically insulated therefrom. The bit lines include one bit-line pair consisting of a first bit line and a second bit line. The memory has memory cells which are electrically connected to the crossing points of the word lines and the bit lines. The cells are field-effect type unipolar transistors.

In the semiconductor memory, a sense amplifier section is connected to the bit-line pair. This section reads, in data readout mode, a data signal from any selected memory cell. More specifically, the sense amplifier section senses the potential difference between the first and second bit lines of the bit-line pair to which the selected memory cell is connected, and then amplifies this difference. The sense amplifier section includes a differential amplifier circuit. The differential amplifier circuit has a driver section having bipolar transistors or resistors, and a load section having unipolar transistors.

Accordingly, a further object of the invention is to provide a new and improved dynamic random access memory device having high reliability.

Another object of the invention is to provide a dynamic random access memory device accomplishing high reliability of data read out.

A dynamic random access memory device is comprised of a plurality of word lines formed on a substrate, a plurality of bit-line pairs formed on the substrate, crossing the plurality of word lines, and memory cells connected to the crossing section of the word lines and the bit lines, each of the memory cells comprising a MOS transistor and a capacitor. A plurality of MOS differential amplifiers respectively has a pair of input nodes and a pair of output nodes and including a pair of driver MOS transistors, the gates of each pair of the driver MOS transistors constituting the pair of input nodes and connected to each of the bit-line pairs.

A BIMOS amplifier has a pair of input nodes and a pair of output nodes and including a pair of driver bipolar transistors, the bases of the bipolar transistors constituting the pair of input nodes, and a plurality of wirings connecting the pairs of the output nodes of the MOS differential amplifiers to the input nodes of the BIMOS amplifier. A plurality of switching means, each switching means respectively inserted in each current path, between each connecting position of the wiring respectively belongs to different said MOS differential amplifiers, and each of the driver MOS transistors. A plurality of MOS amplifiers respectively formed to each of the bit-line pair, the MOS amplifiers amplify a plurality of read out data on the bit-line pairs at a same time for restoring said read out data into the memory cells. A pair of output lines are connected to a pair of output nodes of the BIMOS amplifier.

The invention, and its object and advantages will become more apparent from the following detailed description of the preferred embodiments.

BRIEF DESCRIPTION OF THE DRAWINGS

In the detailed description of the preferred embodiments of the invention, represented below, reference is made to the accompanying drawings of which:

FIGS. 4A to 4O and FIGS. 5A to 5C show the waveforms of the electric signals generated by the major components of the dynamic RAM shown in FIG. 3;

DETAILED DESCRIPTION OF THE PREFERRED EMBODIMENTS

Figure 1:
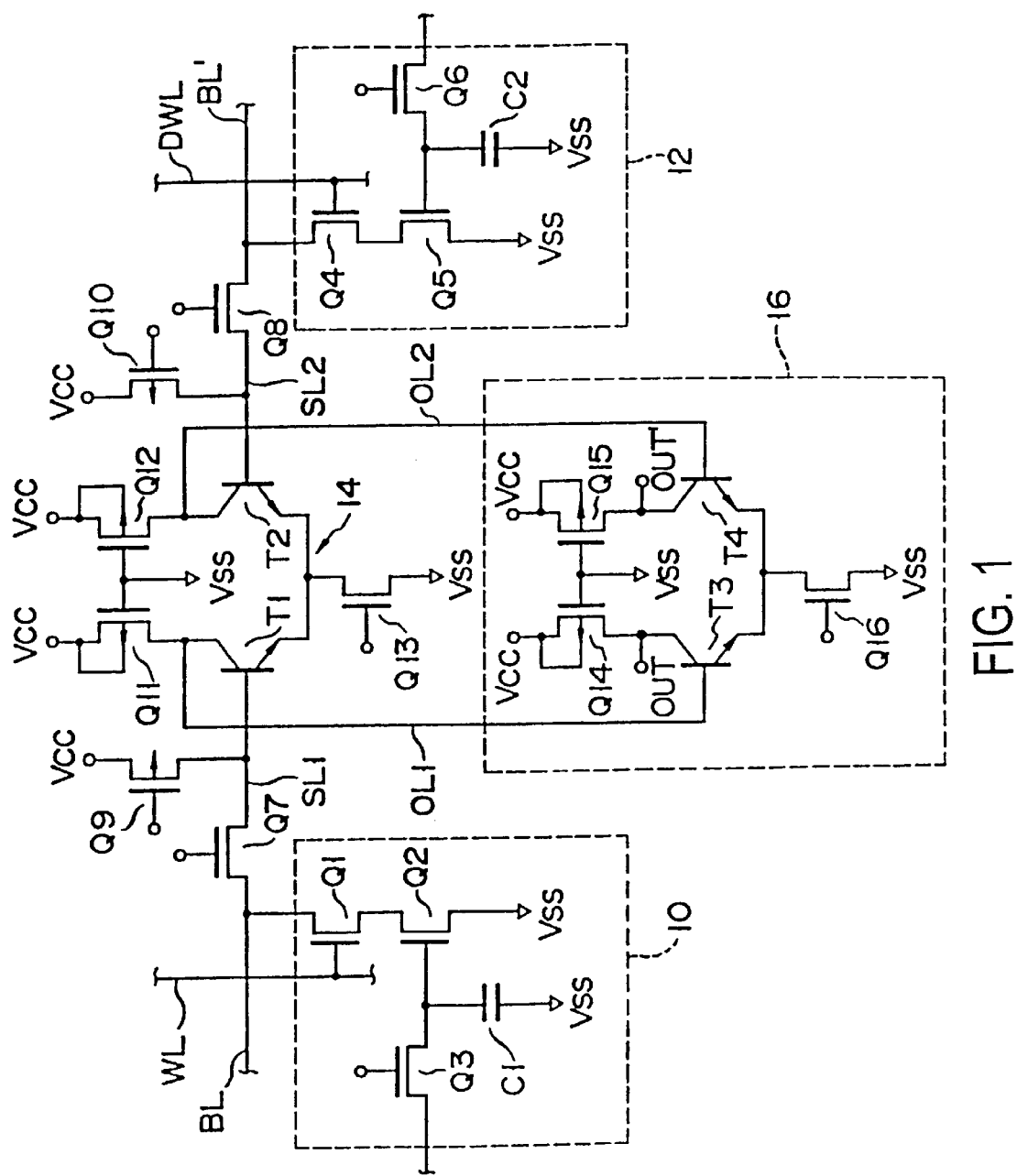
FIG. 1 is a circuit diagram showing a dynamic RAM according to a first embodiment of the present invention.

Referring now to FIG. 1, there is shown one memory cell 10, one dummy cell 12, sense amplifier 14, and amplifier section 16 of a dRAM, the first embodiment of the invention. The substrate of the dRAM is not shown in FIG. 1, for the sake of simplicity only. (Were the substrate illustrated in the figure, it would be represented by a box drawn in broken lines and surrounding the entire circuit illustrated in the figure.) Although only one memory cell 10 and one dummy cell 12 are shown in FIG. 1, the dRAM has a number of memory cells formed on the substrate and arranged in rows and columns, and a number of dummy cells provided for the respective arrays of memory cells, which are coupled to bit lines, as is generally known to those skilled in this field of art.

Memory cell 10 is a current-driven memory cell having three metal oxide semiconductor field-effect transistors, or MOSFETs Q1, Q,2 and Q3, and a MOS type capacitor C1, and is a well-known type cell. The other memory cells (not shown) are of the same structure. Dummy cell 12 and all other dummy cells (not shown) are of the same structure, each having three MOSFETs Q4, Q5 and Q6, and one MOS type capacitor C2. Memory cell 10 is coupled to bit line BL, and dummy cell 12 is connected to bit line BL'. Word line WL is crossing bit line B1. Dummy word line DWL is crossing bit line BL', being electrically insulated therefrom. When bit line BL and ,word line WL are designated, memory cell 10 is selected, wherein switching MOSFET Q1 is rendered conductive. Simultaneously, switching MOSFET Q4 of dummy cell 12, which corresponds to memory cell 10 thus selected, is also rendered conductive. It should be noted, although not illustrated in FIG. 1, that arrayed memory cells are actually provided for the bit lines BL and BL', respectively, and that a dummy cell is provided for the bit line BL' in a known manner.

Bit line BL is connected by MOSFET Q7 to signal input/output line SL1, and bit line BL' is coupled by MOSFET Q8 to signal input/output line SL2. MOSFETs Q7 and Q8 function as transfer gates, and are turned on or off by column select signals. Signal input/output lines SL1 and SL2 are connected to sense amplifier 14. MOSFET Q9, which functions as a load for memory cell 10, and MOSFET Q10, which functions as a load for dummy cell 12, are coupled to sense amplifier 14. Sense amplifier 14 is a differential amplifier of a "Bipolar-MOS" structure, which is known as "BIMOS" structure in this field of art, comprised of bipolar transistors and unipolar (MOS) transistors. More specifically, amplifier 14 has bipolar transistors T1 and T2 used as driver transistors, and MOSFETs Q11 and Q12 used as load transistors. Bipolar transistors T1 and T2 are connected in parallel to each other. Their emitters are connected to activating MOSFET Q13. Their bases are connected to input/output lines SL1 and SL2, respectively. MOSFET Q11 and Q12 are connected in series to bipolar transistors T1 and T2, respectively, and their gates are coupled to each. other.

Output amplifier section 16 is connected by signal output lines OL1 and OL2 to sense amplifier 14. More precisely, signal output line OL1 is coupled to the node of transistors Q11 and T1, and signal output line OL2 is coupled to the node of transistors Q12 and T2. Output amplifier 16 also has the "BIMOS" structure. That is, output amplifier 16 has bipolar transistors T3 and T4 used as driver transistors, and MOSFETs Q14 and Q15 used as load transistors. Bipolar transistors T3 and T4 are connected in parallel to each other. As is shown in FIG. 1, their emitters are coupled to activating MOSFET Q16. The bases of bipolar transistors T3 and T4 are connected signal out-put lines OL1 and OL2, respectively. The gates of these transistors T3 and T4 are connected to each other. Resistors may be used instead of the load transistors in differential amplifiers 14 and 16. Further, in the above embodiment, a known pre-charge circuit (not shown) is also provided so as to pre-charge the bit lines up to a predetermined potential level.

When word line WL and dummy word line DWL, both shown in FIG. 1, are selected, the data signal stored in current-driven memory cell 10 and the data signal stored in current-driven dummy cell 12 are transferred to bit lines BL and BL', respectively. When a column select signal is supplied to transfer gates Q7 and Q8 under this condition, both transfer gates Q7 and Q8 are rendered conductive. The data signal is transferred from bit line BL to signal input/output line SL1 connected to sense amplifier 14. The data signal is transferred from dummy bit line BL' to signal input/output line SL2 coupled to sense amplifier 14. Sense amplifier 14 senses the level difference between these input data signals, and outputs a signal representing this difference. The output signal of sense amplifier 14 is supplied to amplifier section 16 through signal output lines OL1 and OL2. Amplifier 16 amplifies the output signal of sense amplifier 14L. This non-destructive data-reading operation is basically the same as the data-reading operation performed in the conventional dRAMs.

Since sense amplifier 14 is a differential amplifier of the BIMOS structure, including bipolar transistors and MOSFETs, the dRAM of the above embodiment can be accessed at high speed, practically not reducing the integration density of the dRAM whose memory cells have a size of the submicron order. More specifically, since the bipolar transistors are used for the driver unit of sense amplifier 14, the operation of sensing the difference between the memory cell data and the dummy cell data can be effected with maximum speed, which substantially corresponds to that of static dRAMs. There can be thus provided a meritorious dRAM which is excellent both in the integration density and in the data reading operation.

It should be noted that the memory cells and dummy cells of the first embodiment are current-driven cells. The use of these current-driven cells is particularly desirable for sense amplifier 14 the driver section of which comprises bipolar transistors T1 and T2. Were sense amplifier 14 used in the dRAM, which is of voltage-reading type by nature, constituted by only bipolar transistors which are current-driven switching elements, it would be difficult to ensure an operational matching between sense amplifier 14 and the cell matrix. The use of current-driven cells is, therefore, of great significance. Further, the column selection can be performed in order of dynamically reading data from a desired memory cell, before the data voltage is completely saturated on the bit line to which the desired cell is connected. This can help to raise the data reading speed of the dRAM.

Figure 2:
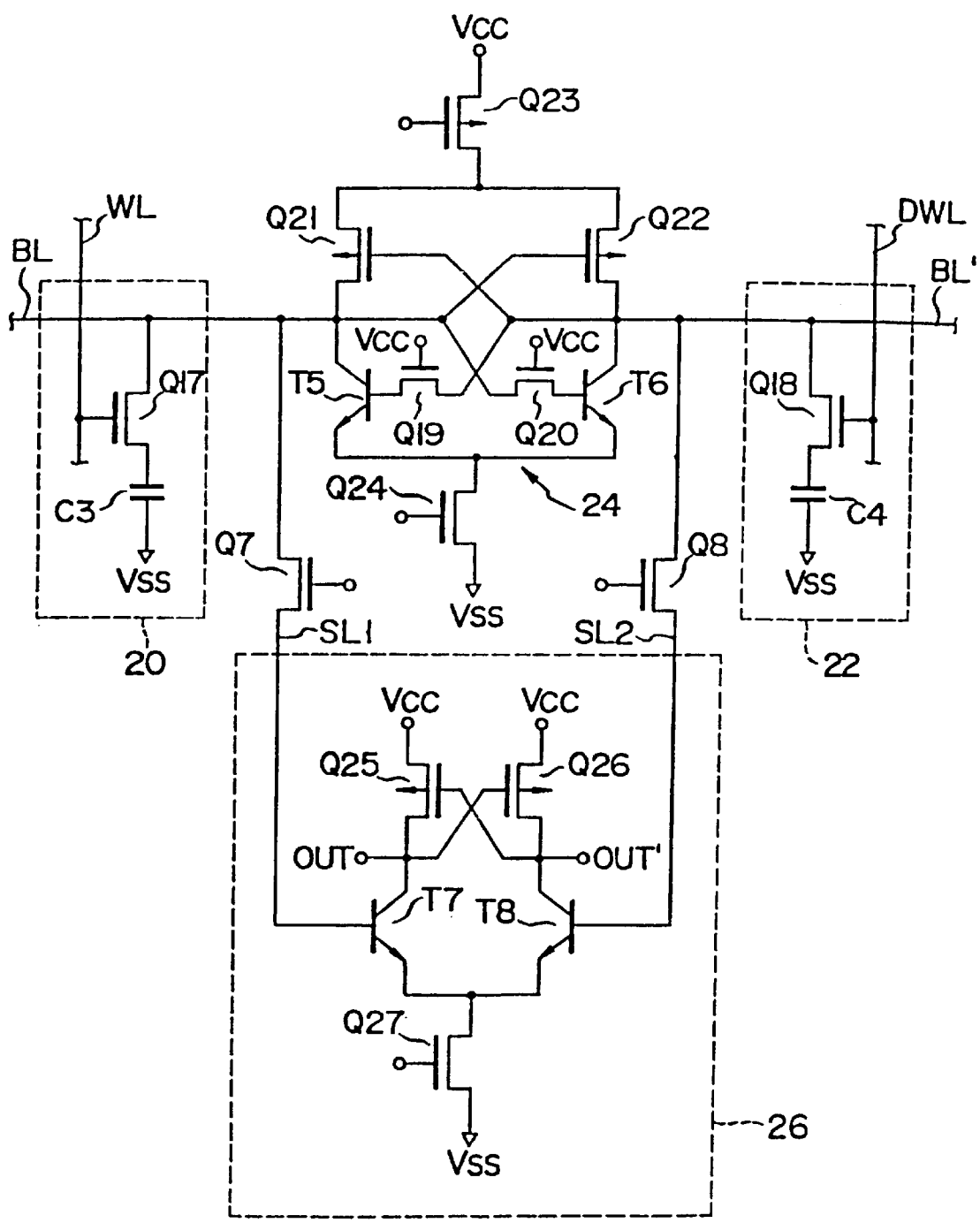
FIG. 2 is also a circuit diagram illustrating another dynamic RAM which is a second embodiment of the invention.

FIG. 2 shows another dRAM, or the second embodiment of the present invention. This dRAM has memory cells of charge-reading type (charge storage type), and dummy cells of charge-reading type. This embodiment is different from the first embodiment in that each cell consists of one capacitor and one transistor. In FIG. 2, the same numerals and symbols are used to the same elements as those illustrated in FIG. 1. The elements identical with those shown in FIG. 1 will not described in detail.

As is shown in FIG. 2, memory cell 20 is provided at the crossing point of word line WL and bit line BL. This memory cell 20 consists of capacitor C3 and MOSFET Q17. Capacitor C3 is used to accumulate the charge corresponding to data, and MOSFET Q17 functions as a switching element. When word line WL is activated, MOSFET Q17 is rendered conductive. Capacitor C3 is thereby electrically connected to bit line BL. Dummy cell 22 is provided at the crossing point of dummy word line DWL and dummy bit line BL'. Dummy cell 22 also consists of capacitor C4 and MOSFET Q18.

Sense amplifier 24, connected to bit line BL and dummy bit line BL', has a driver section and a load section. The driver section includes bipolar transistors T5 and T6. The load section comprises MOSFETs Q19 and Q20 coupled to bases of bipolar transistors T5 and T6, respectively, and functioning as high-impedance elements, and two other MOSFETs Q21 and Q22. High impedance MOSFET Q19 is coupled between the base of bipolar transistor T5 and dummy bit line BL', and the other high-impedance MOSFET Q20 is connected between the base of bipolar T6 and bit line BL. MOSFETs Q19 and Q20 controls the base currents of bipolar transistors T5 and T6 in order to read data from charge-reading type cell 20. They can, thus effectively prevent the high voltage level of the data signal from falling. Sense amplifier 24 has two more MOSFETs Q23 and Q24. MOSFET Q23 is connected between d.c. potential Vcc and the node of the sources of MOSFETs Q21 and Q22, and serves as a first activating transistor. On the other hand, MOSFET Q24 is coupled between ground potential Vss and the node of the emitters of bipolar transistors T5 and T6, and serves as a second activating transistor.

As is shown in FIG. 2 bit line BL is coupled by MOSFET Q7 to signal input/output line SL1, and dummy bit line BL' is coupled by MOSFET Q8 to signal input/output line SL2. MOSFETs Q7 and Q8 function as transfer gates. Both input/output lines SL1 and SL2 are connected to amplifier section 26. Bit lines BL and BL' are driven by a column select signal. Amplifier section 26 is a differential amplifier of the BIMOS structure. More specifically, amplifier section 26 has a driver section comprising bipolar transistors T7 and T8, and a load section comprising MOSFETs Q25 and Q26. The bases of bipolar transistors T7 and T8 are coupled to signal input/output lines SL1 and SL2, respectively. MOSFETs Q25 and Q26 are coupled to the collectors of bipolar transistors T7 and TED, respectively. The emitters of bipolar transistors T7 and T8 are connected to each other, and their node is coupled to activating MOSFET Q27.

The second embodiment can achieve substantially the same advantages as the first embodiment. Moreover, MOSFETs Q19 and Q20, which are high-impedance elements for controlling the base currents of bipolar transistors T5 and T6, and thus operate as impedance-converting elements, can make it possible for bipolar transistors T5 and T6 to constitute a driver section of the sense amplifier of BIMOS structure without lowering the potentials of bit lines BL and BL' from the high voltage level. Hence, the data read from memory cell can be transferred at high speed from sense amplifier 24 to amplifier section 26. The base currents of MOSFETs Q19 and Q20 can be well controlled by bipolar transistors T5 and T6, so that an operational matching can be ensured between sense amplifier 24 including bipolar transistors T5 and T6 (i.e., current-driven switching elements) and the matrix of the voltage-reading type cells. Therefore, in the dRAM of FIG. 2, sense amplifier 24 of the BIMOS structure can be efficiently used though memory cell 20 and dummy cell 22 are of charge reading type.

Figure 3:
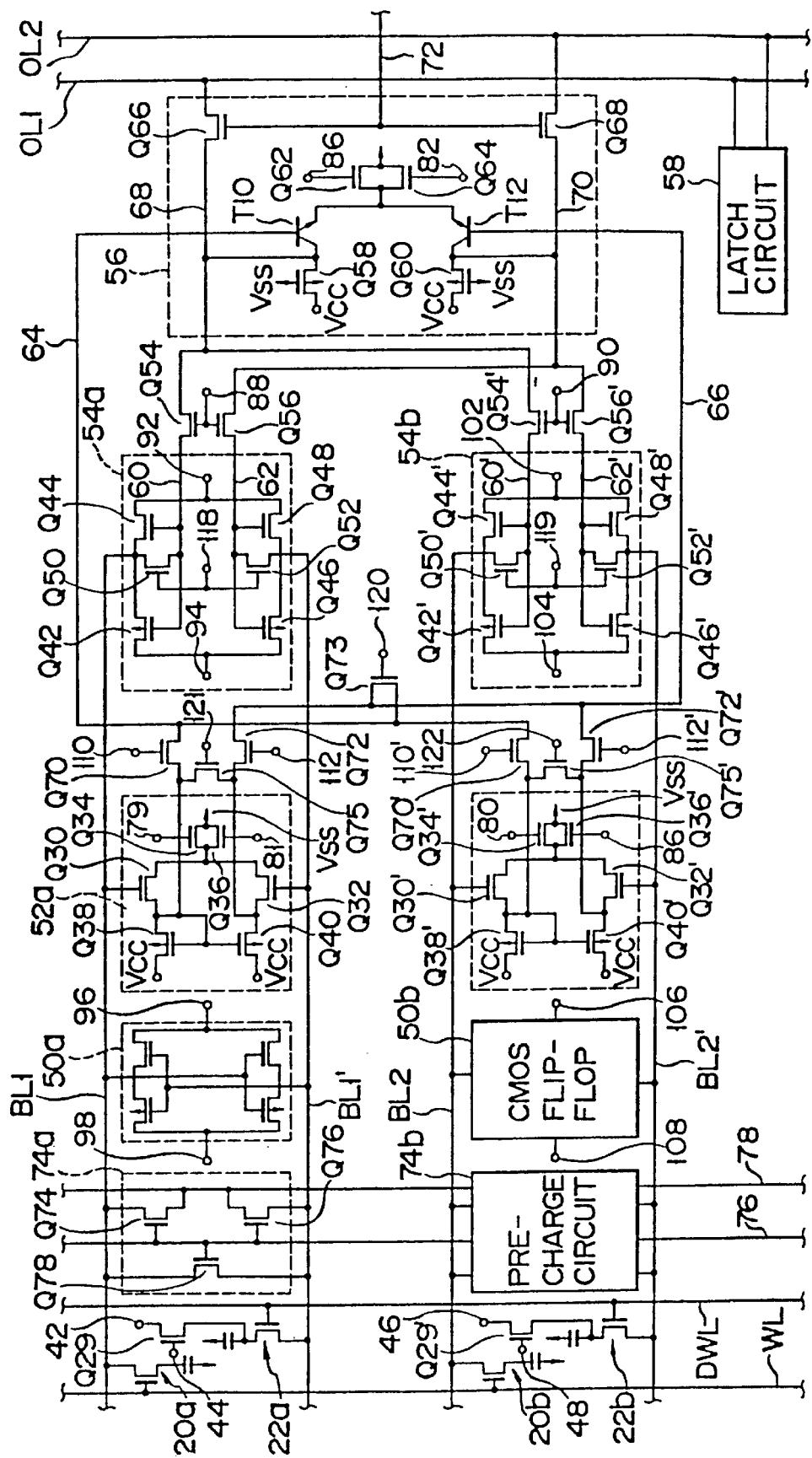
FIG. 3 is a circuit diagram representing still another dynamic RAM which is a third embodiment of this invention.

FIG. 3 shows still another dRAM, or the third embodiment of the invention. This dRAM has cells of charge-reading type, from which data is destructively read out. This dRAM is so designed that data can be destructively read from it at a speed higher than from the dRAM of FIG. 2 which has a sense amplifier of the BIMOS structure.

Two bit-line pairs are illustrated in FIG. 3. The first bit-line pair consists of bit line BL1 and bit line BL1', and the second bit-line pair consists of bit line BL2 and bit line BL2'. One word line WL and one dummy word line DWL are provided, both extending at right angles to bit lines BL1, BL1', BL2 and BL2'. Memory cell 20a is provided at the crossing point of bit line BL1 and word line WL, and memory cell 20b is provided at the crossing point of bit line BL2 and word line WL. Further, dummy cell 22a is provided at the crossing point of bit line BL1' and dummy word line DWL, and dummy cell 22b is provided at the crossing point of bit line BL2' and dummy word line DWL. Each of memory cells 20a and 20b consists of one MOSFET and one capacitor, like the cells of the dRAM shown in FIG. 2. Dummy cell 22 includes a MOSFET Q29, which has a drain electrode 48 to which a write-in voltage of a predetermined potential is applied. The voltage may be supplied to dummy cell 22 when logic "H" leveled voltages are simultaneously applied to drain 42 and gate 44 of MOSFET Q29. The MOSFET and capacitor of each cell are connected to each other and to the bit line and word line, in the same way as in the conventional dRAMs. In FIG. 3, no numerals or symbols are used to designate the MOSFET or capacitor forming each cell.

Memory cell 20a (20b) is provided at the crossing point of word line WL and one bit line BL1 (BL2) of each bit-line pair. Dummy cell 22a (22b) is provided at the crossing point of dummy word line DWL and the other bit line BL1' (BL2') of each bit-line pair. Although only one word line WL is illustrated in FIG. 3 for the aim of simplification, other word lines are provided to have memory cells in the same manner as described above. The dRAM has two dummy word lines one of which is line DWL shown in FIG. 3 and the other of which is not illustrated. The other dummy word line has dummy cells (not shown) in the same manner as described above.

A sense amplifier circuit connected to each bit-line pair includes first flip-flop circuit 50 comprised of CMOSFETs (hereinafter called "first CMOS flip-flop circuit"), current-mirror circuit 52 of CMOSFETs (hereinafter called "CMOS current-mirror circuit"), second CMOS flip-flop circuit 54, and differential amplifier circuit 56 of a "Bipolar-CMOS" structure, which is known as "BIMOS" structure in this field of art. BIMOS differential amplifier circuit 56 is used in common for the two neighboring bit-line pairs (BL1, BL1'; BL2, BL2'). It should be noted in FIG. 3 that the suffix "a" will be used later on for circuit components 50, 52 and 54 provided in the first bit-line pair BL1 and BL1', and the suffix "b" will be used later on for the corresponding circuit components 50, 52 and 54 in the second bit-line pair BL2 and BL2'. Where it is not necessary to distinguish between the first and second bit-line pairs, the suffixes may be dropped. Common BIMOS differential amplifier 56 is connected to a pair of signal output lines OL1 and OL2. Latch circuit 58 is also coupled to these signal output lines OL1 and OL2 to latch and hold the data potential on lines OL1 and OL2.

First flip-flop circuit 50a has four MOSFETs and serves to amplify the potential difference between bit lines BL1 and BL1'. CMOS current-mirror circuit 52a is composed of six MOSFETs, that is two MOSFETs Q30 and Q32 connected at gates to bit lines BL1 and BL1', respectively, two activating MOSFETs Q34 and Q36 connected in parallel with each other and coupled to the node of MOSFETs Q30 and Q32, and two p-channel MOSFETs Q38 and Q40 to which d.c. power supply voltage Vcc is applied as shown in FIG. 3. The circuit configuration of CMOS current-mirror circuit 52b provided in the other bit-line pair (BL2 and BL2') is same as that of CMOS current-mirror circuit 52a, so that dash-marks, (') are used for the corresponding transistors, and the detailed explanation therefor will be omitted.

Second CMOS flip-flop circuit 54a includes a series circuit of MOSFETs Q42 and Q44, and a series circuit of MOSFETs Q46 and Q48. These two series MOSFET circuits are connected in parallel. The gates of MOSFETs Q42 and Q44 are coupled by signal line 60, and the gates of MOSFETs Q46 and Q48 are connected by signal line 62. Second CMOS flip-flop circuit 54a further includes two MOSFETs Q50 and Q52. MOSFET Q50 is connected between line 60 and the node of MOSFETs Q42 and Q44, which in turn is coupled to bit line BL1. MOSFET Q52 is connected between line 62 and the node of MOSFETs Q46 and Q48, which is coupled to bit line BL1'. The gates of MOSFETs Q50 and Q52 are connected to each other. Signal lines 60 and 62 are coupled to differential amplifier circuit 56 by MOSFETs Q54 and Q56, respectively.

MOSFETs Q54 and Q56 function as transfer gates. Their gates are connected to each other. The circuit configuration of CMOS flip-flop circuit 54b in the other bit-line pair BL2 and BL2' is similar to that of CMOS flip-flop circuit 54a, so that dashmarks are used and the detailed explanation thereof will be omitted.

As has been described, differential amplifier circuit 56 is connected in common to the two bit-line pairs (BL1, BL1'; BL2, BL2'). Therefore, signal lines 60 and 60' are coupled to one output terminal of circuit 56, and signal lines 62 and 62' are coupled to the other output terminal of circuit 56. It can thus be considered that two stages of flip-flop circuits 50 and 54 are provided in each bit-line pair to ensure the re-storing of the memory cell data.

BICMOS differential amplifier 56 of the BIMOS structure includes a series circuit of MOSFET Q58 and bipolar transistor T10, and a series circuit of MOSFET Q60 and bipolar transistor T10. The emitters of bipolar transistors T10 and T12 are connected, thus forming a node. This node is coupled to MOSFETs Q62 and Q64 which are connected in parallel. The base of bipolar transistor T10 is connected by signal line 64 to CMOS current-mirror circuit 52 a and 52 b. The base of bipolar transistor T12 is coupled by signal line 66 to CMOS current-mirror circuits 52 a and 52 b. Hence, the output signals of current-mirror circuits 52 a and 52 b are supplied to the base of bipolar transistor T10, and also to the base of bipolar transistor T12. The collector of bipolar transistor T10 is coupled to signal line 60 of flip-flop circuit 54a, and also to signal line 60' of flip-flop circuit 54b, and is conducted to signal line 68. Signal line 68 is connected by MOSFET Q66 to signal output line OL1. The collector of bipolar transistor T12 is coupled to signal line 62 of flip-flop circuit 54a, and also to signal line 62' of flip-flop circuit 54b, and is conducted to signal line 70. Signal line 70 is connected by MOSFET Q68 to signal output line OL2. The gates of MOSFETs Q66 and Q68 are coupled to column select line 72. Signal output lines OL1 and OL2 are connected to an output circuit (not shown) of the known type.

The output terminals of CMOS current-mirror circuit 52 a are connected to lines 64 and 66 via MOSFETs Q70 and Q72 serving as transfer gates, respectively. The output terminals of CMOS current-mirror circuit 52 b are also connected to liens 64 and 66 via transfer gate MOSFETs Q70' and Q72', respectively. Transfer gate MOSFETs Q73, Q75 and Q75' are provided between lines 64 and 66.

Pre-charge circuit 74a (74b) is connected between bit lines BL1 and BL1' (BL2 and BL2'). Precharge circuit 74a is composed of three MOSFETs Q74, Q76 and Q78 whose gates are connected to control line 76, which is common to all pre-charge circuits including illustrated circuits 74a and 74b. MOSFETs Q74 and Q76 are connected to common pre-charge line 78 as shown in FIG. 3. These pre-charge circuits 74 function to pre-charge the corresponding bit lines, after data signals are restored to memory cells 20, such that the voltage potential of each line is set to a predetermined level.

The dRAM of FIG. 3, whose sense amplifier section has BICMOS differential amplifier circuit 56, operates to read bit "0" from memory cell 20a, as will be explained with reference to FIGS. 4A to 40 and FIGS. 5A to 5C which show the waveforms of various signals.

In the active state of dRAM, a row address strobe signal $\overline{RAS}$ falls to logic "L" level as shown in FIG. 4A, and then a column address strobe signal $\overline{CAS}$ falls to logic "L" level as shown in FIG. 4B. As is well known in the,art, a group of low address signals is input to the dRAM substrate in synchronism with row address strobe signal $\overline{RAS}$, while a column address signal group is input in synchronism with column address strobe signal $\overline{CAS}$. When row address strobe signal $\overline{RAS}$ falls to logic "L" level, an activating signal $\phi A$ (see FIG. 4C) is supplied to BIMOS differential amplifier 56 and current-mirror circuits 52 a and S2b. Signal $\phi A$ is supplied to gate terminal 80 of FET Q64 of amplifier 56. Signal $\phi A$ is supplied to gate terminals 79 and 80 if FETs Q34 and Q34' of circuits 52 a and 52 b. Subsequently, when column address strobe signal $\overline{CAS}$ falls to logic "L" level after a predetermined time period has passed since the level change of row address strobe $\overline{RAS}$, column select signals $\phi Y1$, $\phi YA$, $\phi Y\alpha$ (whose signal waveforms are shown in FIGS. 4D, 4F and 4G, respectively) are supplied to current-mirror circuit 52 a and amplifier 56. More specifically, column select signal $\phi Y1$ is supplied to gate terminal 81 of FET Q36 of circuit 52 a. Column select signal $\phi YA$ is supplied to gate terminal 82 of FET Q64 of amplifier 56. Column select signal $\phi Y\alpha$ is input via signal line 72 to gates.of FETs Q66 and Q68 of differential amplifier 56. Column select signal $\phi Y1$ is also supplied to gates 110 and 112 of FETs Q70 and Q72.

FETs Q34, Q34' and Q62 are fabricated such that they are smaller in the size than the corresponding FETs Q36, Q36' and Q64, thereby decreasing power consumption of dRAM. In response to the input of row address strobe $\overline{RAS}$, activating signal $\phi A$ (see FIG. 4C) rises up to logic "H" level, so that small current of several milliamperes flows into current-mirror circuits 52 a and 52 b and BIMOS differential amplifier 56. Bipolar transistors T10 and T12 included in amplifier 56 may thus be preheated by the current flow to prepare for the transistor action thereof. Therefore, even when column address strobe signal $\overline{CAS}$ is delayed, the access time tRAC of dRAM will not be degraded due to the signal delay of column address strobe $\overline{CAS}$.

Thereafter, when word line WL and dummy word line DWL are selected, and the potential of these lines rises as is shown in FIG. 4H, the data stored in memory cell 20a is transferred to bit line BL1, and the data stored in dummy cell 20b is transferred to bit line BL1'. As a result, the potentials of lines BL1 and BL1' changes in accordance with the logic level of data transferred from cells 20a and 20b. Since the dRAM has a memory capacity of 4 megabits or more, the capacitances Cs of each cell is as small as 15 fF (femtfarads). The potential difference $\Delta V1$ between bit lines BL1 and BL1' is extremely low, about 50 mV al most. (See FIG. 5A, wherein $V_{BL1}$ is the potential change in bit line BL1', $V_{BL1}$ is the potential change is bit line BL1', Vout is the potential change in signal output line OL1, and Vout' is the potential change in signal output line OL2.) This small potential difference is amplified by differential amplifier circuit. 56. The potential difference (i.e., a data signal) can be amplified at high speed since the driver section of circuit 56 are constituted by bipolar transistors. The output voltage $\Delta V2$ (FIG. 5A) is about 500 mV.

During the amplification of the potential difference $\phi V1$, which is performed by differential amplifier circuit 56 of the BIMOS structure, CMOS current-mirror circuit 52a coupled to the input terminals of circuit 56, more precisely to the bases of bipolar transistors T10 and T12, functions as an impedance-converting element for differential amplifier circuit 56.

The amplified output voltage of BICMOS differential amplifier circuit 56 is transferred to signal output lines OL1 and OL2 through output transistors Q66 and Q68 which have been rendered conductive by column select signal $\phi Y\alpha$. On the other hand, the output voltage is input to second CMOS flip-flop circuit 54a through MOSFETs Q54 and Q56 (i.e., the transfer gates). More specifically, the potential $\phi T1$ see FIG. 4I) at gate terminal 88 common to MOSFETs Q54 and Q56, i.e., the transfer gates for flip-flop circuit 54a, rises to logic "H" level some time after the potential rise of the selected bit line BL1 and the selected dummy bit line BL1' (see FIG. 4H), as is illustrated in FIG. 4I. (At this time, the potential T2 (see FIG. 4L) at gate terminal 90 common to MOSFETs Q54' and Q56', i.e., the transfer gates for CMOS flip-flop circuit 54b, remains at logic "L" level as is shown in FIG. 4J.) In response to the output voltage of amplifier circuit 56, MOSFETs Q54 and Q56 become conductive. The output voltage is therefore fed back to second CMOS flip-flop circuit 54athrough these MOSFETs Q54 and Q56.

An input voltage ΔV2 applied to CMOS flip-flop circuit 54a is thus as high as 500 mV. Hence, the potential φSB1 at source terminal 92 common to MOSFETs Q44 and Q48 changes as; is shown by the solid line in FIG. 4J, and the potential $\overline{\phi SB1}$ at source terminal 94 common to MOSFETs Q42 and Q46 changes as is shown by the broken line in FIG. 4J. The potential on bit line BL1 and the potential on bit line BL1' can thus be quickly raised when flip-flop circuit 54a is activated. Therefore, CMOS flip-flop circuit 54a can re-store the data read from memory cell 20a, both quickly and efficiently. The abovementioned amplified output voltage of BIMOS differential amplifier 56 cannot be raised to the d.c. power supply voltage Vcc of the dRAM. Hence, in order to ensure the re-storing of the data read from memory cell 20a, it is necessary to cut off flip-flop circuit 54a when the potential difference ΔV2 (FIG. 5A) between lines BL1 and BL1' increases to about 2 V, and to operate first CMOS flip-flop circuit 50a, thus increasing potential difference ΔV2 to value ΔV3 (FIG. 5A) substantially equal to d.c. power supply voltage Vcc. To render first CMOS flip-flop circuit 50a operative, the potentials φSA1 and $\overline{\phi SA1}$ at two terminals 96 and 98 common to the MOSFETs of flip-flop circuit 50a are changed as is shown in FIG. 4K, wherein the solid line represents potential φSA1, and the broken line indicates potential $\overline{\phi SA1}$.

The operation of reading data from cells 20a and 20b connected to bit-lines BL1 and BL1' and of restoring the data is called "first access cycle." The period of this first access cycle is "Ta1" as illustrated in FIG. 4A. The operation of re-storing data of memory cell 22b coupled to the second bit-line pair (i.e., lines BL2 and BL2') is called "second access cycle." The period of the second access cycle is "Ta2" as shown in FIG. 4A. Before the second access cycle Ta2 starts, signals φY1, φYA, φYα and φT1—all used in the first access cycle—are set at logic "L" level in order to avoid an interference between the bit lines BL and in order to reset each circuit connected thereto, as is illustrated in FIGS. 4D, 4F, 4G and 4I. Even under this condition, the cell data on lines BL1 and BL1' are stably held by latch circuit 58. Cell data thus read out is output by a known output circuit (not shown), which is connected to output lines OL1 and OL2, as a data output signal Dout.

In the second access mode, CMOS current-mirror circuit 52b coupled to the second bit-line pair, i.e., bit line BL2 and bit line BL2', are rendered operative, since signal φY2 supplied to gate 86' of MOSFET Q36, has the logic "H" level. Then, the potential at terminal 82 of BIMOS differential amplifier circuit 56 rises to logic "H" level, whereby circuit 56 is rendered operative again. The potential difference between bit lines BL2 and BL2' may be amplified by BIMOS differential amplifier 56. Then, gate-open signal φT2 having the waveform shown in FIG. 4L is supplied to transfer gate terminal 90 provided between second CMOS flip-flop circuit 54b and differential amplifier circuit 56. Signal φSB2 having the waveform represented by the solid line shown in FIG. 4M is supplied to the terminal 102 of second CMOS flip-flop circuit 54b, said terminal 102 corresponding to the terminal 92 of flip-flop circuit 54a. (The broken line in FIG. 4M shows the waveform of signal $\overline{\phi SB2}$ input to the terminal 104 of flip-flop 54b.) Then, signal φSA2 having the waveform shown in FIG. 4N by the solid line is supplied to the terminal 106 of first flip-flop circuit 50b, said terminal 106 corresponding to the terminal 96 of flip-flop circuit 50a. (The broken line in FIG. 4N shows the waveform of signal $\overline{\phi SA2}$ input to the terminal 108 of flip-flop circuit 50b.) As a result, the pieces of data which are read from cells 22a and 22b coupled to bit lines BL2 and BL2', respectively, are re-stored. If required, the data of memory cell 20b thus read out may be output from output Lines OL1 and OL2, by setting the signal φYα to the logic "H" level.

The access operation of dRAM is completed, when row address strobe $\overline{RAS}$ and column address strobe $\overline{CAS}$ sequentially fall to logic "L" level, for the precharging, as shown in FIGS. 4A and 4B, respectively. At this time, the voltage potentials on word line WL and dummy word line DWL fall to logic "L" level. The dRAM is thus set in the pre-charging mode. In this pre-charging mode, reset signal φEQL (whose signal waveform is shown in FIG. 4D) is preferably supplied to gate terminals 118 and 119 of second flip-flop circuit 54a which are connected in common with each other, gate terminal 120 of FET Q73, gate terminals 121 and 122 of FETs Q75 and Q75'. The voltage difference between bit liens BL2 and BL2' is sequentially amplified, in the second access mode, to thereby obtain voltages ΔV1, ΔV2 and ΔV3 as shown in FIG. 5B. In FIG. 5B, "$V_{BL2}$" and "$V_{BL2'}$" represent the voltage potentials on bit lines BL2 and BL2', respectively.

In the pre-charge mode, FETs Q74, Q76 and Q78 of pre-charge circuit 74 are rendered conductive by applying control line 76 with a control signal of logic "H" level. When these FETs are conductive, a pre-charge voltage of a pre-determined potential is simultaneously applied to all the bit lines BL and BL'. The potential of the pre-charge voltage is half (Vcc/2) the d.c. power supply voltage Vcc of dRAM, for example. The capacitance of each dummy cell 22 is same as that of memory cell 20.

Dummy cells 22a and 22b store therein a certain voltage having a middle potential level which is included in a range between logic "H" level and logic "L" level. The voltage-storing in dummy cells 22 is performed at a suitable timing after the completion of the access period. The voltage-storing in dummy cells 22 may be performed by closing dummy word line DWL after the pre-charging operation is completed with respect to each bit-line pair. In this case, write-in FETs Q74 may be removed from the circuit configuration. Furthermore, dummy cells 22, themselves, may be deleted if a certain circuit means (not shown) is provided in dRAM to accurately hold the pre-charge level to the aforementioned potential level (i.e., Vcc/2).

The dRAM having BIMOS differential amplifier circuit 56, i.e., the third embodiment of the invention, can achieve both the operation of reading data and the operation of re-storing data, at a sufficiently high speed, even if its memory cells have a size of the submicron order and have, hence, a capacitance Cs as small as ten and odd femtfarads (fF). This is because: even if cell capacitance Cs decreases extremely, and the cell data voltage thereby falls, the cell data voltage can be raised by the sense amplifier section which includes BIMOS differential amplifier 56 and two flip-flop circuits 50a (50b) and 54a (54b).

Although first CMOS flip-flop circuit 50a (50b) and second CMOS flip-flop circuit 54a (54b) have an amplification factor equal to that of the conventional CMOS flip-flop circuits, they can efficiently re-store the data on bit lines BL1 and BL1' (or lines BL2 and BL2'). This is because the input signal of second flip-flop circuit 54a (54b) has already been amplified by differential amplifier circuit 56 at high speed and supplied through MOSFETs Q54 and Q56 functioning as transfer gates. Even if the potential difference between the bit lines of each pair is as small as 50 mV due to the small cell size of the 4-megabit dRAM which has a high integration density, this potential difference can be increased to the desired degree in a short period of time, by the two-step amplification described above. The speed of re-storing data can be raised very much.

Furthermore, since cell capacitance Cs can be about half the value (e.g., 30 fF) required in the conventional dRAMs. Hence, the dRAM shown in FIG. 3 can operate reliably, and can have a high integration density.

Furthermore, according to this dRAM, under such a condition wherein column address strobe $\overline{CAS}$ falls to logic "L" level after a predetermined time period has passed sine the level change of row address strobe $\overline{RAS}$, bipolar transistors T10 and T12 of BIMOS differential amplifier 56 can be pre-heated or pre-activated before column address strobe $\overline{CAS}$ falls to logic "L" level. In other words, these bipolar transistors T10 and T12 can be previously activated at the time of selecting word line WL of dRAM, and, thereafter, fully activated at the time of selecting a specific pair of bit lines (BL1 and BL1', for example). It is thus possible to activate the bipolar transistors with maximum speed, thereby much improving the data accessing speed of dRAM.

Figure 6:
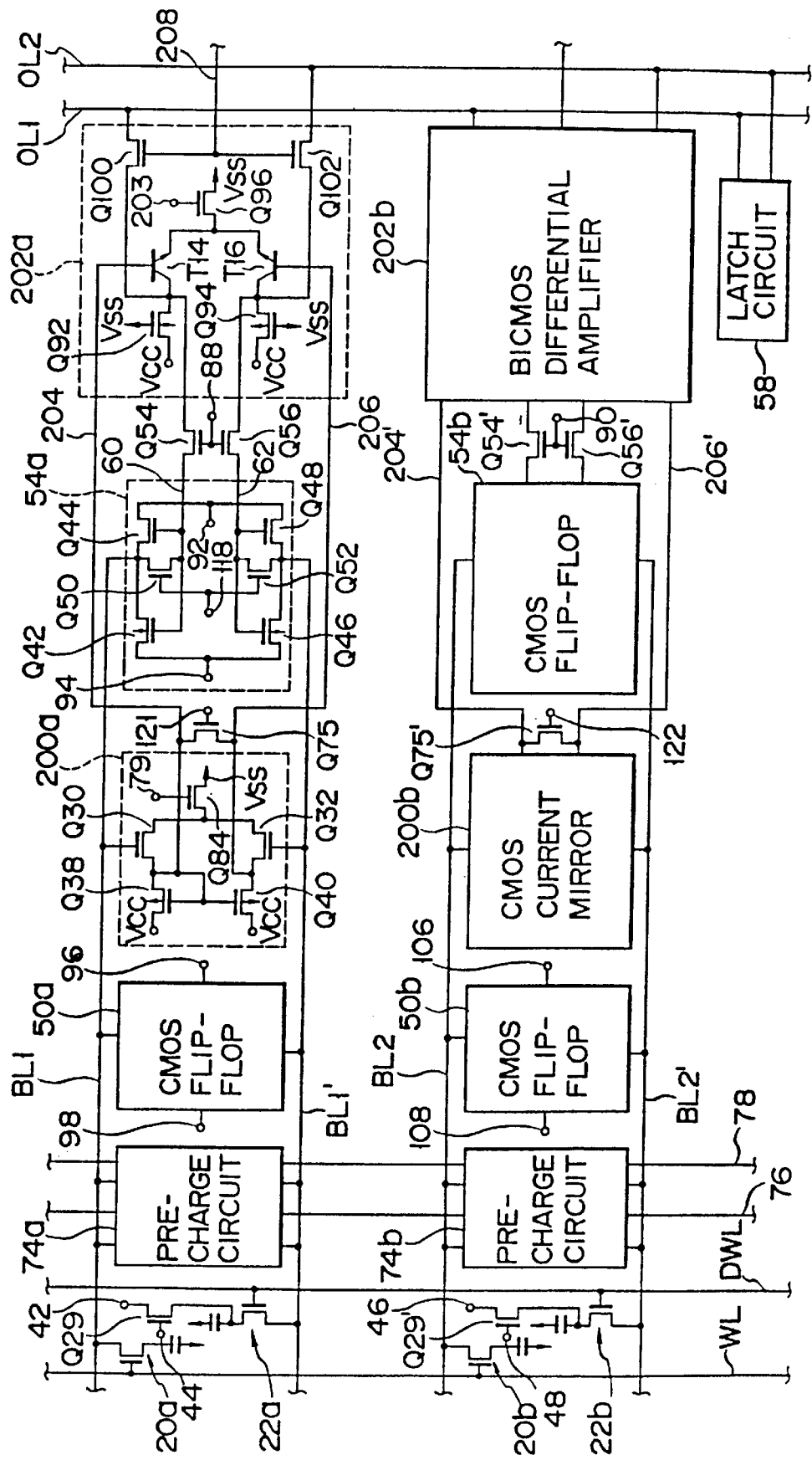
FIG. 6 is a circuit diagram showing another dynamic RAM according to a fourth embodiment of this invention.

FIG. 6 shows a further dRAM, i.e., a fourth embodiment of the present invention. This dRAM differs from that of FIG. 3 in that one differential amplifier circuit is coupled to each bit-line pair. In FIG. 6, the same numerals and symbols are used to denote the same elements as those shown in FIG. 3. And the same elements will now be described in detail.

As is shown in FIG. 6, CMOS current-mirror circuit 200 and BIMOS differential amplifier circuit 202 are provided for each pair of bit lines BLi and BLi'. In a pair of bit lines BL1 and BL1', current-mirror circuit 200a functions as an impedance-converting element for differential amplifier circuit 202a. In current-mirror circuit 200a, the sources of MOSFETs Q30 and Q32 are connected in common with each other, and coupled to MOSFET Q84. The drain of MOSFET Q30 is connected by signal line 204 to the base of bipolar transistor T14 included in differential amplifier circuit 202a. The drain of MOSFET Q32 is coupled by signal line 206 to the base of bipolar transistor T16 also included in circuit 202a. Hence, the output of CMOS current-mirror circuit 200a is input to BICMOS differential amplifier circuit 202a.

BICMOS differential amplifier circuit 202a is provided between second CMOS flip-flop circuit 54a, on the one hand, and signal output lines OL1 and OL2. The collectors bipolar transistors T12 and T16 are coupled to MOSFETs Q92 and Q94, respectively, and are connected to flip-flop circuit 54a by MOSFETs Q54 and Q56, respectively. MOSFETs Q54 and Q56 operate as transfer gates. The emitters of bipolar transistors T14 and T16 are connected, thus forming a node. This node is connected to MOSFET Q96. Differential amplifier circuit 202a includes MOSFETs Q100 and Q102. MOSFET 100 is connected in series between the collector of bipolar transistor T14 and signal output line OL1. MOSFET Q102 is connected in series between the collector of bipolar transistor T16 and signal output line OL2. Hence, bipolar transistors T14 and T16 receives the current signal from current-mirror circuit 200a as the base input signal, and supply output signals to second flip-flop circuit 54a and also to signal output lines OL1 and OL2, respectively. The gates of MOSFETs Q100 and Q102 are coupled, thus forming a node. This node is connected to row-select line 208.

CMOS flip-flop circuit 54b and differential amplifier circuit 202b are connected to each of the other bit-line pairs (only another bit-line pair, i.e., bit line BL2 and dummy bit line BL2', is shown in FIG. 6.) circuits 54b and 202b are identical in circuit configuration to circuits 54a and 202a.

CMOS flip-flop circuit 50b and CMOS current-mirror circuit 200b are also connected to the bit-line pair, i.e., bit line BL2 and dummy bit line BL2', are identical in structure with circuits 50a, 200a and 202a. Therefore, circuits 50b, 200b, 54b and 202b are indicated as blocks in FIG. 6 for simplicity's sake.

The dRAM of FIG. 6 operates to read and restore data in the same manner as the dRAM of FIG. 3, except that the re-storing operation is performed simultaneously with respect to all the bit-line pairs provided on the dRAM chip substrate. Since one differential amplifier circuit is provided for each bit-line pair, the integration density of dRAM is lower than that of the dRAM shown in FIG. 3. Nonetheless, the cell data on any bit-line pair can be more efficiently amplified than in the dRAM of FIG. 3. In other words, the fourth embodiment (FIG. 6) is advantageous over the third embodiment (FIG. 3) with regard to data read/restore ability.

Figures 7A, 7B, 7C, 7D, 7E, 7F, 7G, 7H, 7I, 7J:
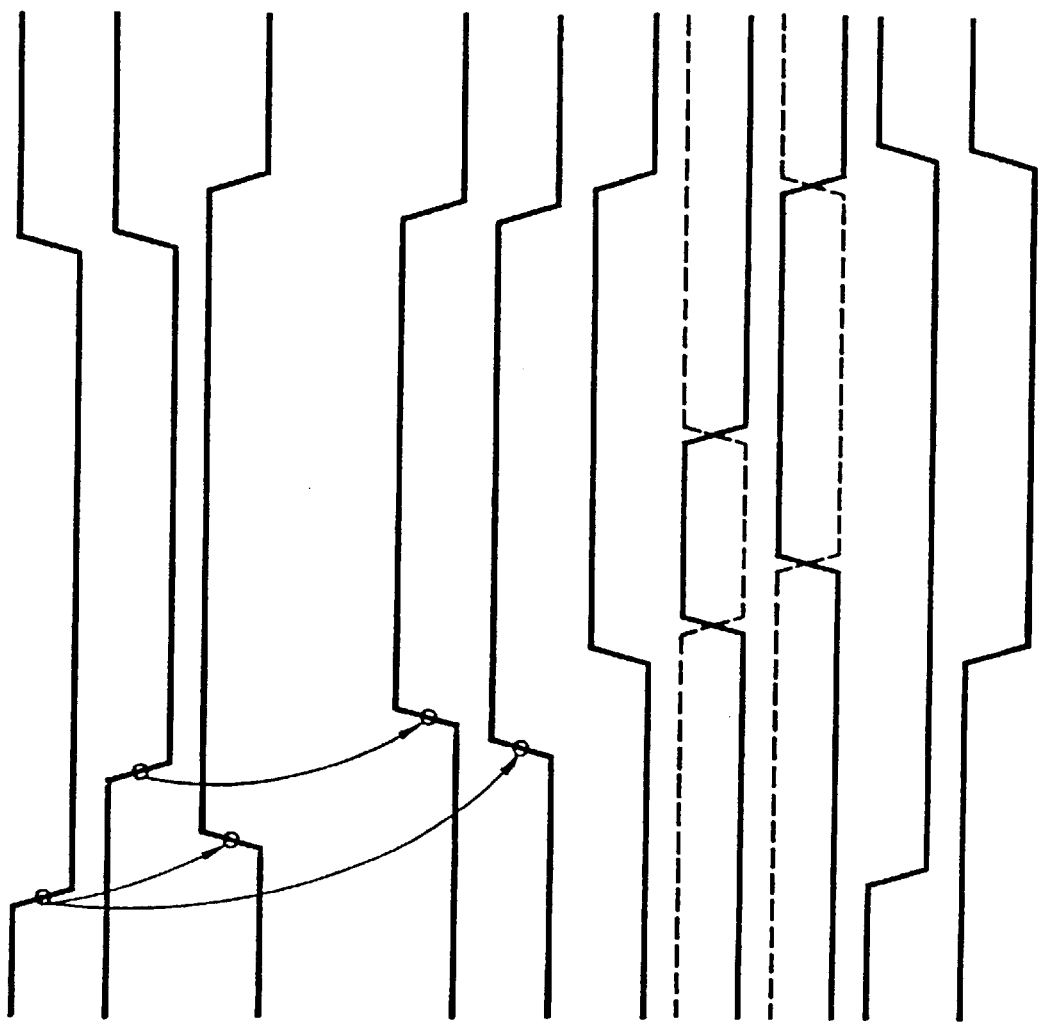
FIGS. 7A to 7J show the waveforms of the electric signals generated by the major components of the dynamic RAM shown in FIG. 6.

The operation mode of the dRAM shown in FIG. 6, which is the fourth embodiment of the invention, will be explained with reference to FIGS. 7A to 7J showing the waveforms of various signals. When row-address strobe signal $\overline{RAS}$, whose waveform is shown in FIG. 7A, is input to the dRAM chip, activating signal φA rises to the logic "H" level, as is shown in FIG. 7C. Signal φA is supplied to FET Q84 of CMOS current mirror circuit 200 provided for each pair of bit lines BL1 and BL1', and also to FET Q96 of BICMOS differential amplifier circuit 202 provided for bit lines BL1 and BL1'. These FETs Q84 and Q96 are rendered conductive, whereby CMOS current mirror circuit 200 and BICMOS differential amplifier circuit 202a are activated.

Thereafter, when column-address strobe signal $\overline{CAS}$, whose waveform is shown in FIG. 7B, is input to the dRAM chip, column select signal φYB rises to the logic "H" level, as is shown in FIG. 7D. In order to select memory cell 20a, signal φYB is supplied to transfer gate FET Q100 connected between output line OL1 and BICMOS differential amplifier circuit 202a, and also to transfer gate FET Q102 coupled between output line OL2 and amplifier circuit 202a. These FETs Q100 and Q102 are therefore rendered conductive. When the potential of dummy word line DWL, and the potential of word line WL selected by row-address strobe signal $\overline{RAS}$ rise to the logic "H" level, the potential difference between bit lines BL1 and BL1' is amplified at high speed by BICMOS differential amplifier circuit 202a. The output signal of circuit 202a is transferred to output Lines OL1 and OL2.

While data is being read from memory cell 20a, signal φT supplied to gate terminals 88 and 90 rises to the logic "H" level, as is shown in FIG. 7F. Activating signals φSB and $\overline{φSB}$, whose waveforms are represented by the solid and broken lines in FIG. 7G, respectively, are supplied to terminals 92 and 94 of second CMOS flip-flop circuit 54 provided for each pair of bit lines BLi and BLi'. When activating signals φSA and $\overline{φSA}$, whose waveforms are indicated by the solid and broken lines in FIG. 7H, respectively, are supplied to terminals 96 and 98 of first CMOS flip-flop circuit 50, the output signal of second CMOS flip-flop circuit 54 is further amplified by first CMOS flip-flop circuit 50. Hence, the output signal of circuit 54 rises to a sufficiently high level required to re-store the data. The dRAM thereafter operates substantially in the same way as the third embodiment shown in FIG. 3.

Figure 8:
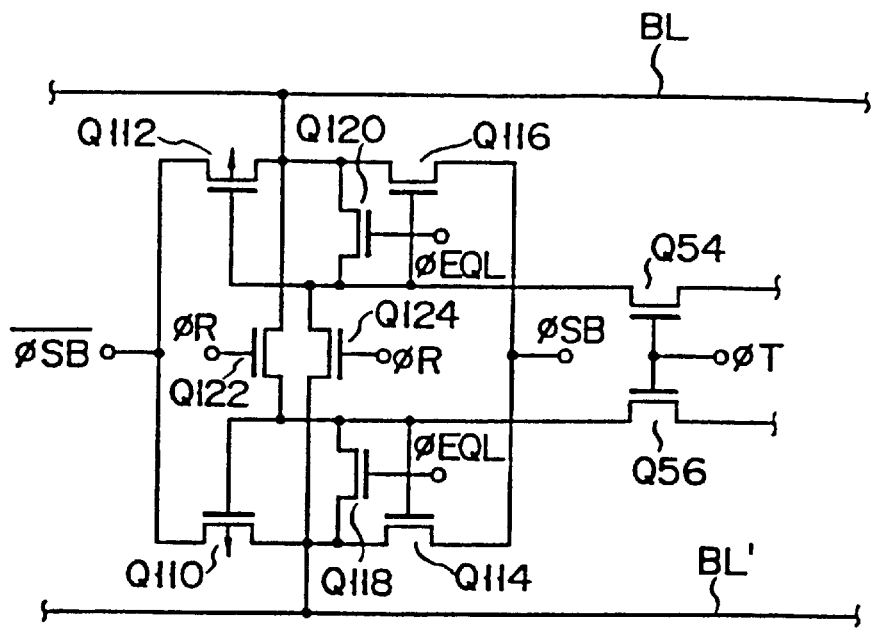
FIG. 8 is a circuit diagram representing a modification of a flip-flop circuit used in the dynamic RAM of FIG. 6.

In the third and fourth embodiments, first CMOS flip-flop circuit 50 and second CMOS flip-flop circuit 54 are provided for each pair of bit lines BLi and BLi' in order to re-store the data read from any memory cell. These CMOS flip-flop circuits 50 and 54 may be so modified as to be selectively operated. FIG. 8 shows a CMOS flip-flop circuit so modified.

Figure 9A:
FIGS. 9A and 9B show the waveforms of the electric signals generated in the flip-flop circuit shown in FIG. 8.
Figure 9B:

The flip-flop circuit of FIG. 8 is composed of P-channel MOSFETs Q110 and Q112, and N-channel MOSFETs Q114, Q116, Q118, Q122 and Q124. Equalizing signal φELQ is supplied to the gates of FETs Q118 and Q120. Switching control signal φR is supplied to the gates of FETs Q122 and Q124. When the potential of transfer gate control signal φT, which is supplied to the common gates of transfer FETs Q54 and Q56, rises to the logic "H" level as is shown in FIG. 9A, both FETs 54 and 56 are rendered conductive, thereby amplifying the output signal of BICMOS differential amplifier 56a or 202a to voltage ΔV2. When the potential of switching control signal φR rises to the logic "H" level thereafter, as is shown in FIG. 9B, the signal can be amplified from voltage ΔV2 to the re-store level.

Figure 10:
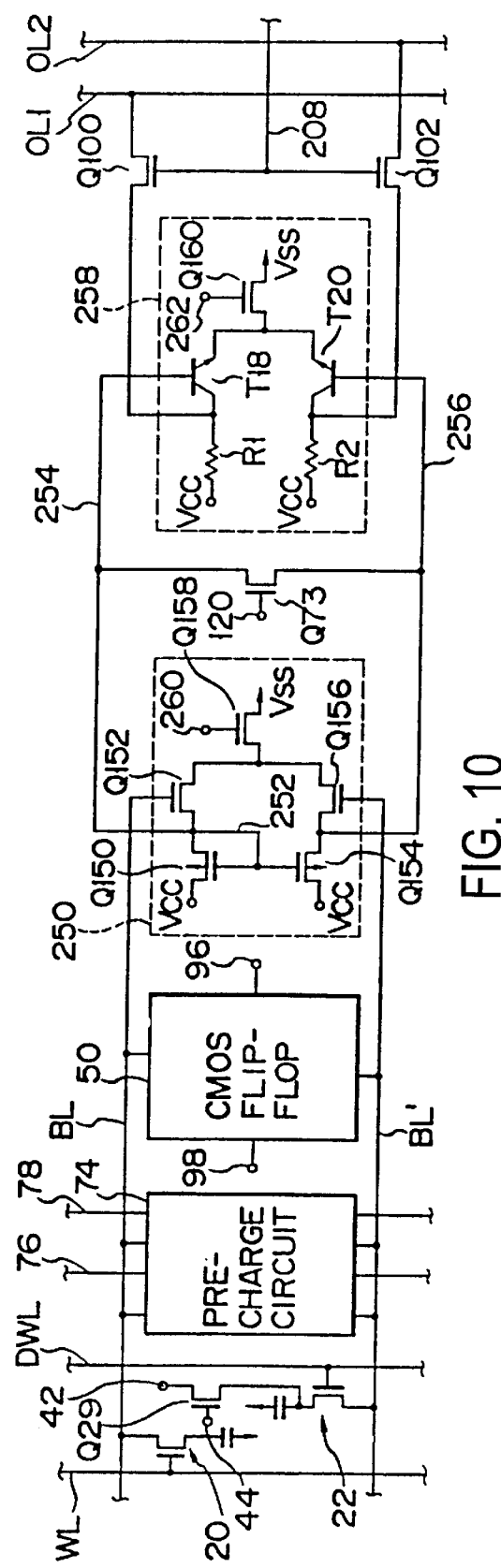
FIGS. 10 and 11 are circuit diagrams partially representing dynamic RAMs in accordance with other embodiments of the present invention.
Figure 11:
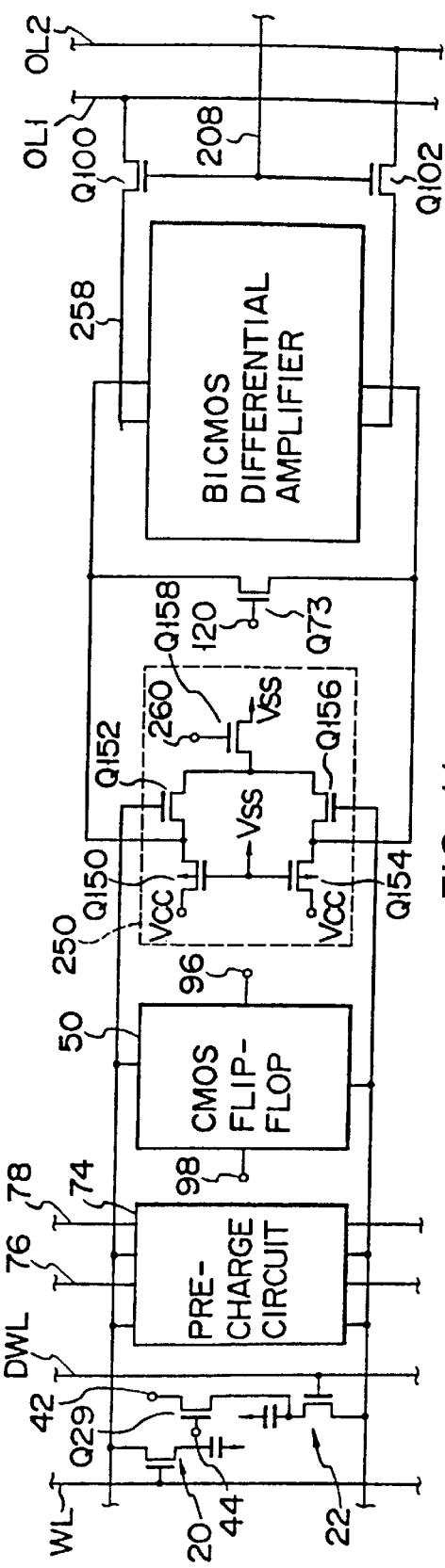

FIGS. 10 and 11 show another dRAM, i.e., a fifth embodiment of the present invention. In these figures, the same elements as those used in the third embodiment (FIG. 3) and in the fourth embodiment (FIG. 6) are designated by the same numerals. And these elements will not be described in detail. In FIGS. 10 and 11, only one pair of bit lines BL and BL' are illustrated.

In the dRAM of FIG. 10, MOS differential amplifier circuit 250 is connected between bit lines BL and BL'. This circuit 250 functions as a buffer circuit. Precharge circuit 74 and CMOS flip-flop circuit 50 are also coupled to bit lines BL and BL' in the same way as in the third embodiment (FIG. 3) and in the fourth embodiment (FIG. 6). Differential amplifier circuit 250 includes a load transistor, i.e., P-channel MOSFET Q150, and a driver transistor, i.e., N-channel MOSFET Q152. Load FET Q150 and driver FET Q152 constitute a current path. Circuit 250 further includes a load transistor, i.e., P-channel MOSFET 154, and a driver transistor, i.e., N-channel MOSFET Q156. Load FET Q154 and driver FET Q156 constitute a current path. FETs Q152 and Q154 are their gates coupled to bit lines BL and BL', respectively. The sources of FETs Q152 and Q154 are connected. The common source of FETs Q152 and Q154 is connected to ground potential source Vss by an activating transistor, i.e., N-channel MOSFET Q158. The gates of FETs Q150 and Q152 are connected. One of output signals of MOS differential amplifier 250 is fed back to the common gate of FETs Q150 and Q152 through line 252.

MOS differential amplifier circuit 250 is connected by lines 254 and 256 to BICMOS differential amplifier circuit 258 having two bipolar transistors T18 and T20. Equalizing MOSFET Q73 is coupled between lines 254 and 256. More specifically, the node of FETs Q150 and Q152, which are connected in series, is coupled to the base of bipolar transistor T18 by line 154. The node of FETs Q154 and Q156, which are connected in series, is coupled to the base of bipolar transistor T20 by line 256. Bipolar transistors T18 and T20 are connected in series to resistors R1 and R2, respectively. These resistors R1 and R2 can be replaced by P-channel MOSFETs (not shown). The emitters of bipolar transistors T18 and T20 are connected to each other, and are coupled to ground potential source Vss by enabling MOSFET Q160. Equalizing MOSFET Q73 is connected between lines 246 and 256.

The circuit shown in FIG. 11 is identical in structure to the circuit of FIG. 10, except that the common gate of FETs Q150 and Q154 is directly coupled to ground potential source Vss. Therefore, BICMOS differential amplifier circuit is simply represented by a block in FIG. 11.

Figures 12A, 12B, 12C, 12D, 12E, 12F, 12G:
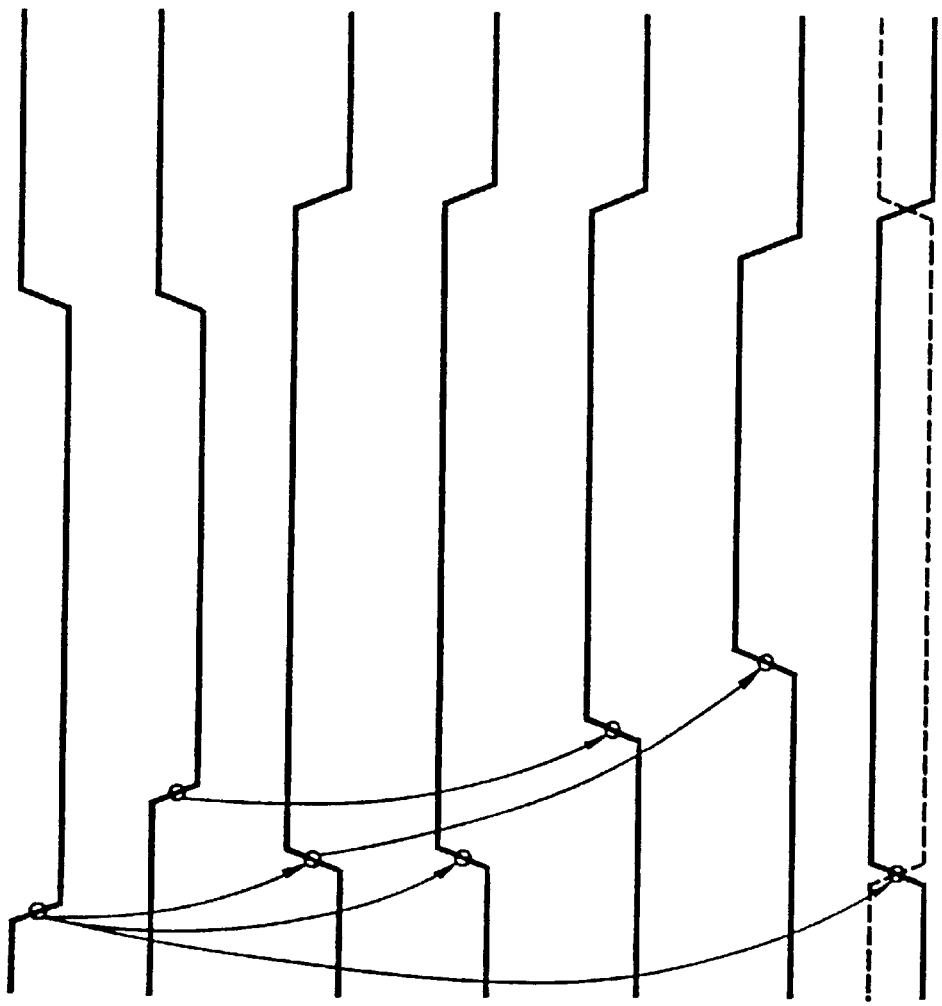
FIGS. 12A to 12G show the waveforms of the electric signals generated by the major components of the dynamic RAMs shown in FIG. 10 or FIG. 11.

The operation mode of the dRAM shown in FIGS. 10 and 11, i.e., the fifth embodiment of the invention, will be explained with reference to FIGS. 12A to 12G showing the waveforms of various signals. When row address strobe signal $\overline{RAS}$, whose waveform is shown in FIG. 12A, is input to the dRAM chip, activating signal φA rises to the logical "H" level, as is shown in FIG. 12C. Signal φA is supplied to gate terminal 260 of FET Q158 of CMOS differential amplifier circuit 250. FET Q158 is therefore rendered conductive, thereby activating circuit 250. Another activating signal φB supplied to gate terminal 262 of FET Q160 of BICMOS differential amplifier circuit 258 rises to the logic "H" level, as is shown in FIG. 12D. Then, FET Q160 is rendered conductive, thus activating circuit 258.

Thereafter, when column-address strobe signal $\overline{CAS}$, whose waveform is shown in FIG. 12B, is input to the dRAM chip, column select signal φY rises to the logic "H" level, as is shown in FIG. 12B. As a result, the potential of line 208 rises to the logic "H" level. When the potentials of word line WL and dummy word line DWL both rise to the logic "H" level, the cell data, which has been amplified by BICMOS differential amplifier circuit 258, is transferred to output lines OL1 and OL2 through transfer gates FETs Q100 and Q102. On the other hand, the cell data read out to bit line BL is re-stored when activating signal φSA and $\overline{\phi SA}$ are supplied to terminals 96 and 98 of CMOS flip-flop circuit 50, thereby closing word line WL.

MOS differential amplifier circuit 250 is important since it functions as a CMOS buffer circuit for supplying a base current to BICMOS differential amplifier circuit 258. BICMOS differential amplifier circuit 258 can be driven in four methods. In which method it is driven depends on the combination of one of the two circuit configurations shown in FIGS. 10 and 11 and one of two different activating voltage levels. More specifically, BICMOS differential amplifier circuit 2S8 is driven:

Example I: When the circuit of FIG. 10, wherein the output of FET Q150 is fed back to the gate of FET 150, is used, and activating voltage φA (e.g., 1.6 V), which is lower than the d.c. power supply voltage Vcc (e.g., 5 V) of the dRAM, is applied to gate terminal 260 of FET 158.

Example II: When the circuit of FIG. 10 is used, and activating voltage φA (e.g., 5.0 V), which is as high as the d.c. power supply voltage Vcc of the dRAM, is applied to gate terminal 260 of FET 158.

Example III: When the circuit of FIG. 11, wherein the common gate of FETs Q150 and Q152 is coupled to ground potential source Vss, is used, and activating voltage φA (e.g., 1.6 V), which is lower than the d.c. power supply voltage Vcc of the dRAM, is applied to gate terminal 260 of FET 158.

Example IV: When the circuit of FIG. 11 is used, and activating voltage φA (e.g., 5.0 V), which is as high as the d.c. power supply voltage Vcc of the dRAM, is applied to gate terminal 260 of FET 158.

The inventors thereof have conducted simulation on Examples I to IV of MOS differential amplifier circuit 250, and studied the changes in the amplification factor of BICMOS differential amplifier circuit 258, which had occurred the changes in the process parameter or the input voltage. In the simulation, it was assumed that P-channel FETs Q150 and Q154 had threshold level Vth of −0.8 V, and that N-channel FETs Q152, Q156 and Q158 had threshold level Vth of +0.8 V. Further it was assumed that bipolar transistors T18 and T20 of BICMOS differential amplifier circuit 258 had an emitter size 2×5 µm², $h_{FE}$ of 85 and resistance of 2 KΩ. It was also assumed that the gate-input voltage φB of FET Q160 was 1.6 V, that the d.c. power supply voltage of the dRAM was also 5.0 V, that the pre-charge voltage of bit lines BL and BL' was Vcc/2, and that the potential difference ΔVin between bit lines BL and BL' of each pair was 50 mV.

Figure 13:
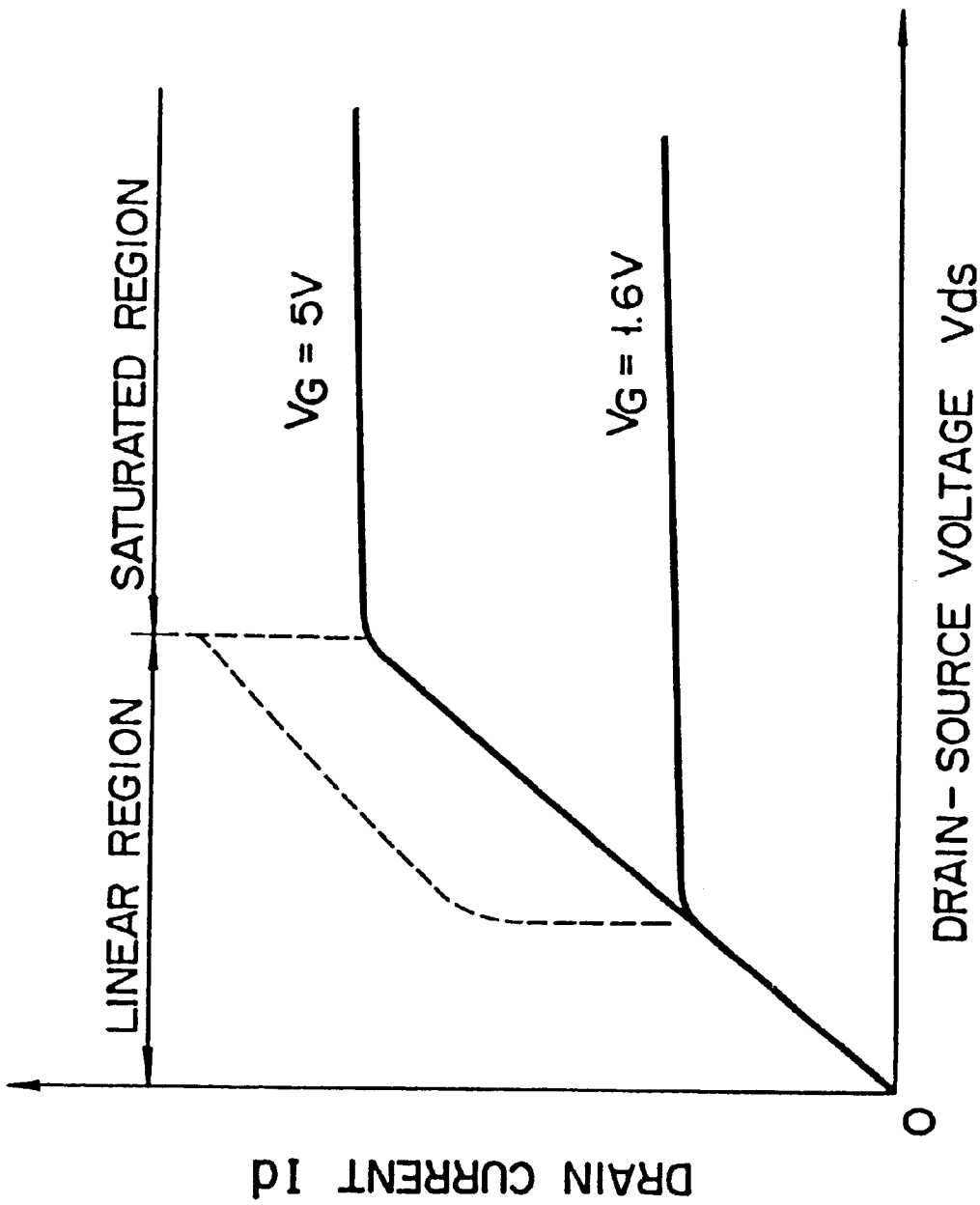
FIG. 13 is a graph the voltage-current characteristics of a MOSFET used in a CMOS circuit section serving as a buffer for a BIMOS differential amplifier of the dynamic RAMs shown in FIGS. 10 and 11.

FIG. 13 shows the voltage characteristics which FET Q158 of circuit 250 has when activating voltage φA, or VG, applied to the gate of FET Q158 is 1.6 V and 5.0 V. When voltage φA is 1.6 V as in Examples I and III, FET Q158 operates in its saturated region. In this case, the drain current Id of FET Q158 is constant, regardless of the changes in the source-drain voltage Vds of FET Q158. On the other hand, when voltage φA is as high as 5.0 V as in Examples II and IV, FET Q158 operates in its linear region. If this is the case, the drain current Id of FET Q158 increases substantially in proportion to the source-drain voltage Vds. In short, FET Q158 operates in the linear region when Vds is less than Vgs-Vth (Vds<Vgs-Vth) where "Vgs" is the gate-source voltage of FET Q158, and operates in the saturated region when Vds is greater than Vgs-Vth.

Figure 14:
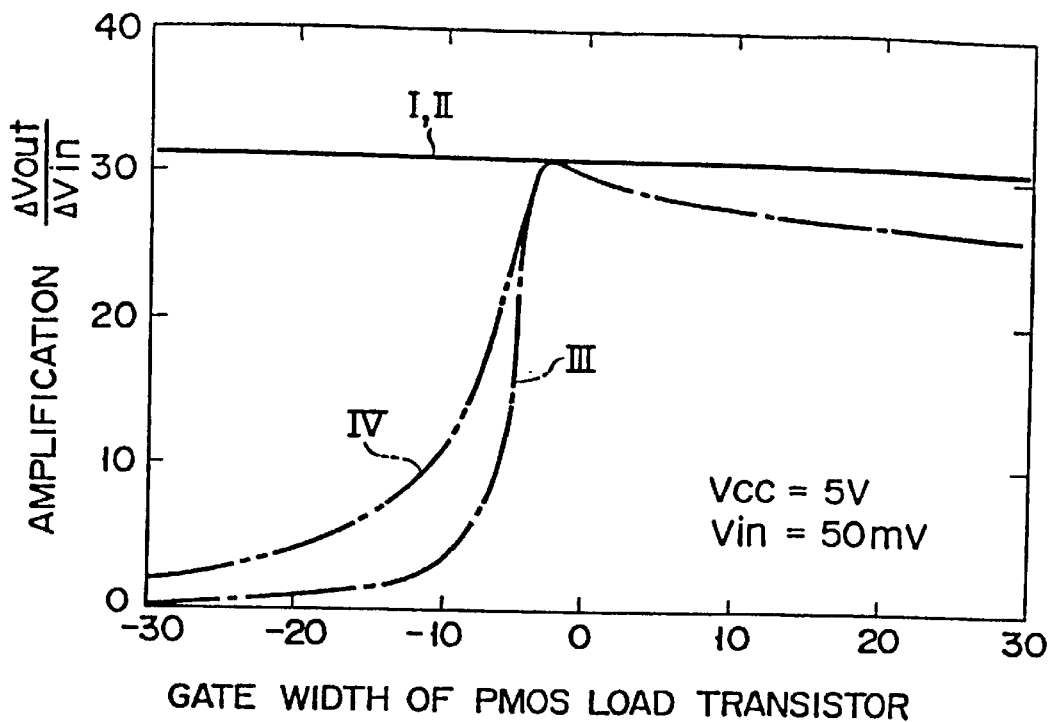
FIG. 14 is a graph showing operational characteristics of a sense-amplifier with respect to deviation in the gate width of a load transistor in the CMOS buffer circuit of the dynamic RAMs shown in FIGS. 10 and 11.

Firstly, the relationship between the change in a process parameter of FET Q158 and the β ratio of this FET was analyzed. FIG. 14 illustrated how the d.c. amplification factor of BICMOS differential amplifier circuit 258 varies when the gate width of P-channel MOSFET Q158, which is a load transistor, change due to alterations of manufacture process. The change of the gate width is defined by (w-wo)/wo, where "w" is the gate width of actually fabricated FET Q158, and "wo" is the design value of the gate width. The amplification factor of BICMOS differential amplifier circuit 258 is given as Vout/ΔVin, where "ΔVin" is the potential difference between bit lines BL and BL' (i.e., the input voltage of CMOS buffer circuit 250), and "ΔVout" is the potential difference between the output lines of BICMOS differential amplifier 258 (i.e., the voltage corresponding to the amplified output signal of BICMOS differential amplifier circuit 258. In the graph of FIG. 14, curves I, II, III and IV represent the characteristics of Examples I, II, III and IV, respectively.

As can be clearly understood from FIG. 14, Examples I and II, wherein the circuit of FIG. 10 is used as differential amplifier circuit 250 functioning as a CMOS buffer, were proved advantageous in that the amplification factor of BICMOS differential amplifier circuit 258 remains unchanged even if the gate width of FET Q158 increases or decreases by 30% from the design value. Also as is evident from FIG. 14, it was ascertained that, in Examples III and IV, wherein the circuit of FIG. 11 is sued as CMOS buffer circuit 250, the amplification factor of BICMOS differential amplifier circuit 258 is extremely reduced if the gate width of FET Q158 decreases by 5% from the design value. In view of this, it is desirable that circuit 250, in which one output of CMOS buffer 250 is fed back to the common gate of FETs 150 and 154, should be used in order to keep the amplification factor of circuit 258 unchanged.

Figure 15:
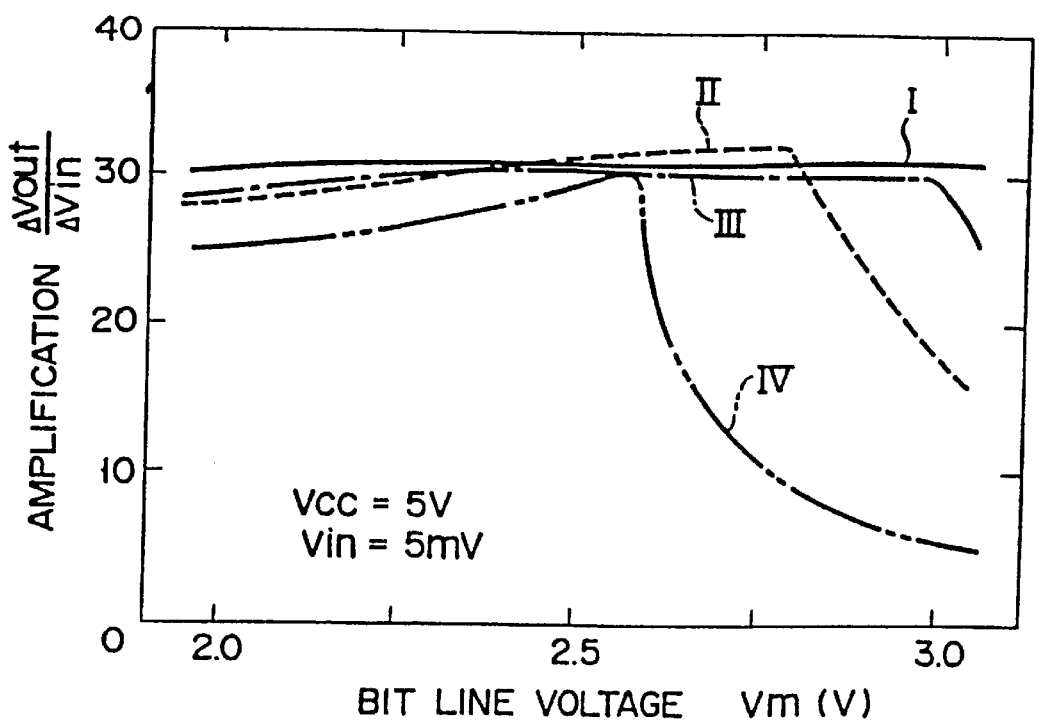
FIG. 15 is a graph showing operational characteristics of the sense-amplifier with respect to change in the central level of input voltage of the load transistor in the CMOS buffer circuit of the dynamic RAMs shown in FIGS. 10 and 11.

Secondly, the influence of the changes in the mean potentials Vm of bit lines BL and BL' on the d.c. amplification factor of BICMOS differential amplifier circuit 258 was analyzed. FIG. 15 shows characteristic curves I, II, III and IV of Examples I, II, III and IV. As is evident from FIG. 15, it was proved that, in Examples I and III, wherein low activating voltage φA of about 1.6 V is applied to gate terminal 260 of FET Q158 of CMOS buffer circuit 250, and FET Q158 therefore operates in the linear region and is thus used as a constant current source, the amplification factor of BICMOS differential amplifier circuit 258 remains substantially constant even if the mean bit-line voltage Vm changes but within the range from 2.0 V to 3.0 V. Hence, Examples I and III can be said to be most desirable. It was proved that, in Example II, the amplification factor of circuit 258 remains substantially constant even if the bit-line voltage Vm increases to about 2.5 V. In other words, the amplification factor can be substantially constant even if the mean bit-line voltage Vm changes by about 0.4 V, provided Vm is half the d.c. power supply voltage Vcc of the dRAM. Therefore, Example II can be used when it is required that activating voltage φA similar to voltage Vcc be used, in which case no additional circuit for generating a low voltage of 1.6 V is necessary for MOS differential amplifier 250, and the circuit configuration of the dRAM can be simplified.

In view of the results of the simulation, Example II is considered best of the four examples. Although it is slightly inferior to Example I as far as the fluctuation of voltage Vm is concerned, Example II is the simplest in structure. Further, in view of this results of the simulation, it will be understood that CMOS buffer circuit 250 shown in FIGS. 10 and 11 is not limited to a MOS differential amplifier circuit; circuit 250 can be made of only a current mirror circuit, excluding FET Q158.

Figure 16:
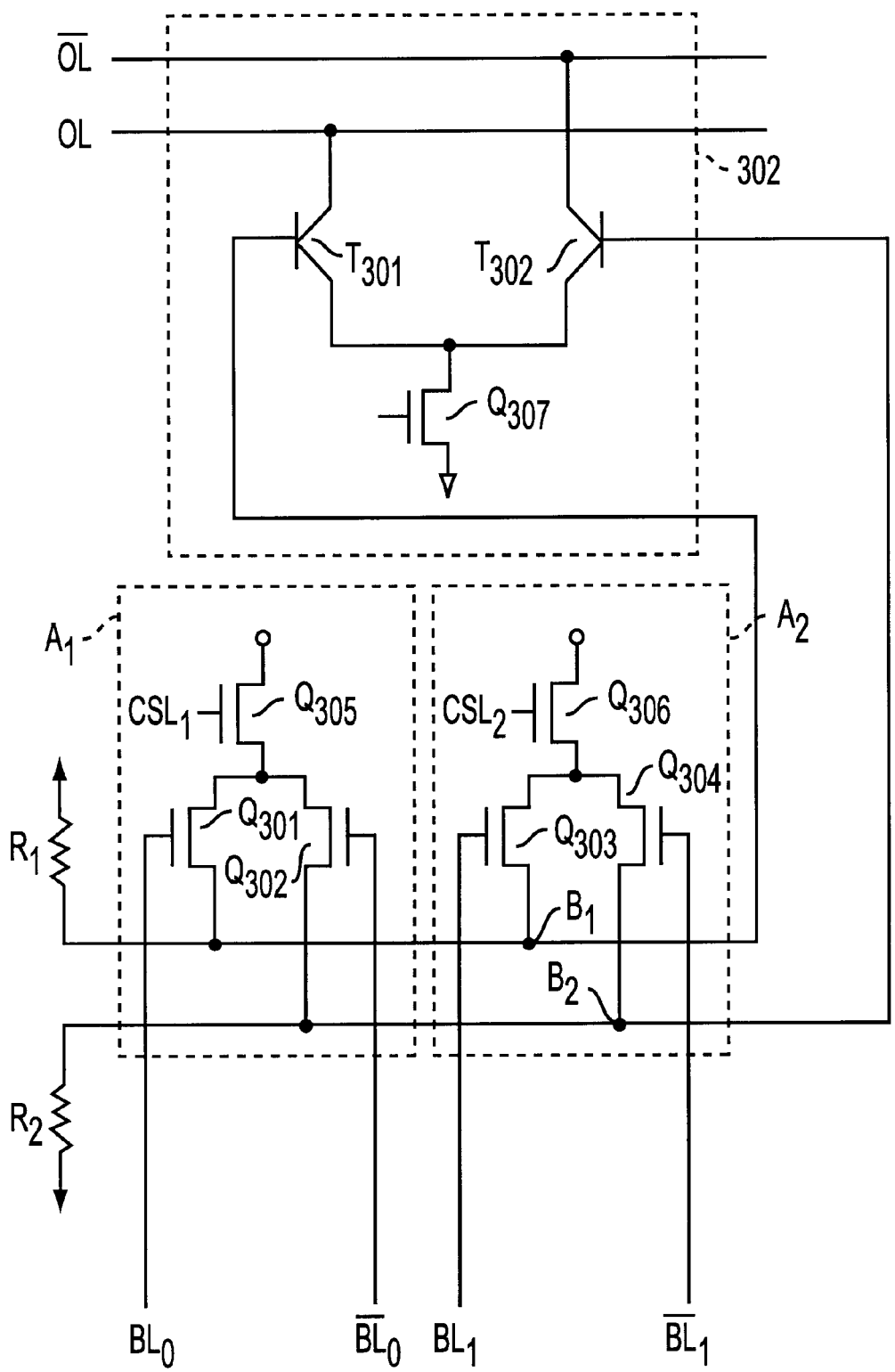
FIG. 16 is a circuit diagram showing a conventional BIMOS bit line sense amplifier.

FIG. 16 is a circuit diagram of a conventional BIMOS sense amplifier for DRAMS. The sense amplifier consists of MOS differential amplifiers $A_1$, $A_2$, as buffers formed for every bit-line pair (BL0, $BL_0$), ($BL_1$, $BL_1$) and a BIMOS differential amplifier 302 using bipolar transistors. The MOS differential amplifiers $A_1$, $A_2$ use resistors $R_1$, $R_2$ as their loads. The gates of driver MOS transistors $Q_{301}$ and $Q_{302}$ of the MOS differential amplifier $A_1$ are respectively connected to the bit-line pair $BL_0$, $BL_0$, and the gates of driver MOS transistors $Q_{303}$ and $Q_{304}$ of the MOS differential amplifier $A_2$ are respectively connected to another bit-line pair $BL_1$, $BL_1$. Output modes of these MOS differential amplifiers $A_1$ and $A_2$ are commonly connected to the bases of bipolar transistors $T_{301}$ and $T_{302}$, which are input terminals of the BIMOS differential amplifier 2. One of the MOS amplifiers $A_1$, $A_2$ is selected by selectively driving one of the gates of the activate MOS transistors $Q_{305}$ and $Q_{306}$ with column select clocks $CLS_1$ and $CLS_2$.

In the case using such a BIMOS sense amplifier, there is a problem of interference of data that arises for the reason that one BIMOS differential amplifier 302 is commonly used for two sets of buffer MOS differential amplifiers $A_1$ and $A_2$. For example, the case where the column select clocks are $CSL_1$="h" and $CSL_2$="L" so that $BL_0$, $BL_0$ in two sets of bit-line pairs are selected, will now be described. In this instance, in the MOS differential amplifier $A_2$ of the un-selected bit-line pair $BL_1$, $BL_1$, the common source or drain of the driver MOS transistors $Q_{303}$, $Q_{304}$ is in a floating condition because the activate MOS transistor $Q_{306}$ is "off". On the contrary, there is an "on" condition for both of the driver MOS transistors $Q_{303}$ and $Q_{304}$, until the "H" and "L" levels of the bit-line pair $BL_1$ and $BL_1$ are apparently fixed in the sensing period. Thus, there arises a direct current pass between output nodes $B_1$ and $B_2$ through these MOS transistors $Q_{303}$ and $Q_{304}$, nevertheless being in high resistance. This becomes the cause of the data interference so that the sensitivity of data sensing between the bit-line pair $BL_0$ and $BL_0$ undesirably lessens. Further, the output nodes $B_1$, $B_2$ are capacitor-coupled with bit-lines $BL_1$ and $BL_1$ through driver MOS transistors $Q_{303}$ and $Q_{304}$ in the MOS differential amplifier $1_2$. Therefore, the potentials on bit lines $BL_1$ and $BL_1$ of un-selected side influence the output data noise. This also becomes the cause of deterioration of sense sensitivity.

Figure 17:
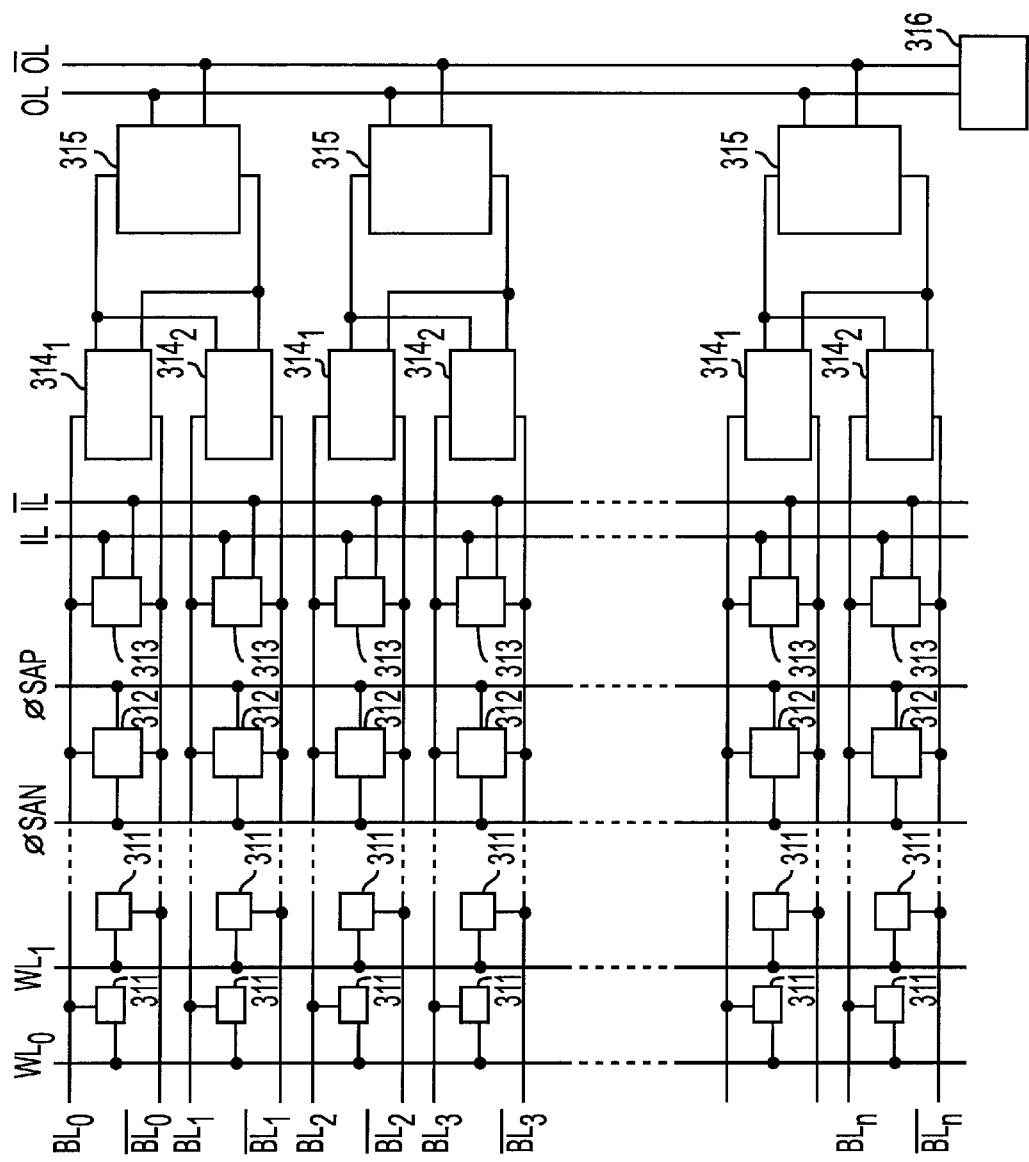
FIG. 17 is a layout of the DRAM circuit of the embodiment of the present invention.

Referring now to FIG. 17, there is schematically shown a dynamic random access memory circuit according to an embodiment of the present invention.

Figure 18:
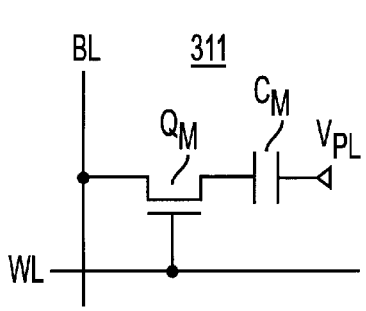
FIG. 18 is a circuit diagram of the memory cell in FIG. 17.

In FIG. 17, the numeral 11 shows a DRAM memory cell. The memory cell, as illustrated in FIG. 17, consists of a MOS transistor $Q_M$ and a capacitor $C_M$, as shown in FIG. 18. A memory cell array is fabricated from a matrix arrangement using such DRAM cells on a semiconductor substrate. A plurality of bit-line pairs BL, BL ($BL_0$, $\overline{BL_0}$, $BL_1$, $\overline{BL_1}$, . . . $BL_n$, $\overline{BL_n}$) respectively, receive and give informational electric charges to memory cells 311 and a plurality of word lines WL ($WL_0$, $WL_1$, . . . ) selectively drive the memory cells 311. A pair of dummy cells may be connected to each bit-line pair, as is well known.

Figure 19:
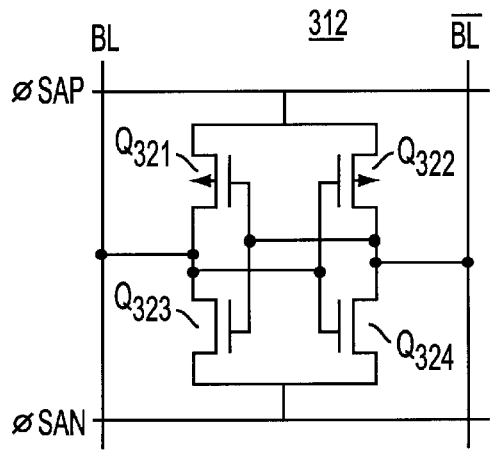
FIG. 19 is a circuit diagram of the CMOS flip flop in FIG. 17.
Figure 20:
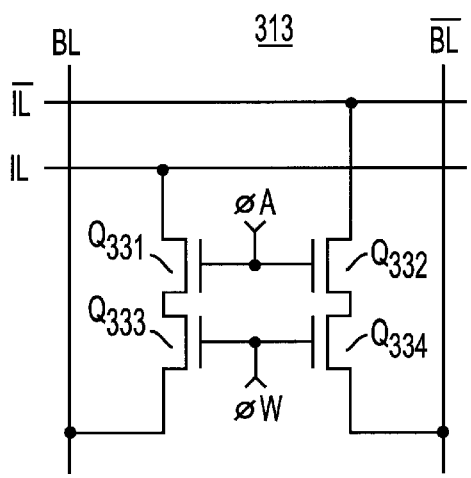
FIG. 20 is a circuit diagram of the input circuit in FIG. 17.

For each bit-line pair B1, BL, a CMOS flip-flop 312 is formed as an amplifier for performing "active restoring" in the reading and writing periods. As shown in FIG. 19, the CMOS flip-flop 312 comprises a pair of p channel MOS transistors $Q_{321}$, $Q_{322}$ and a pair of n channel MOS transistors $Q_{323}$, $Q_{324}$, as is well known. Between each bit-line pair BL, BL and input data lines. IL, IL, an input circuit 313 is formed for data writing. This input circuit 313 is constructed, for example, as shown in FIG. 20, to comprise transfer gate n-channel MOS transistors $Q_{331}$, $Q_{332}$ to which α write clock $\phi_W$ is applied.

Figure 21:
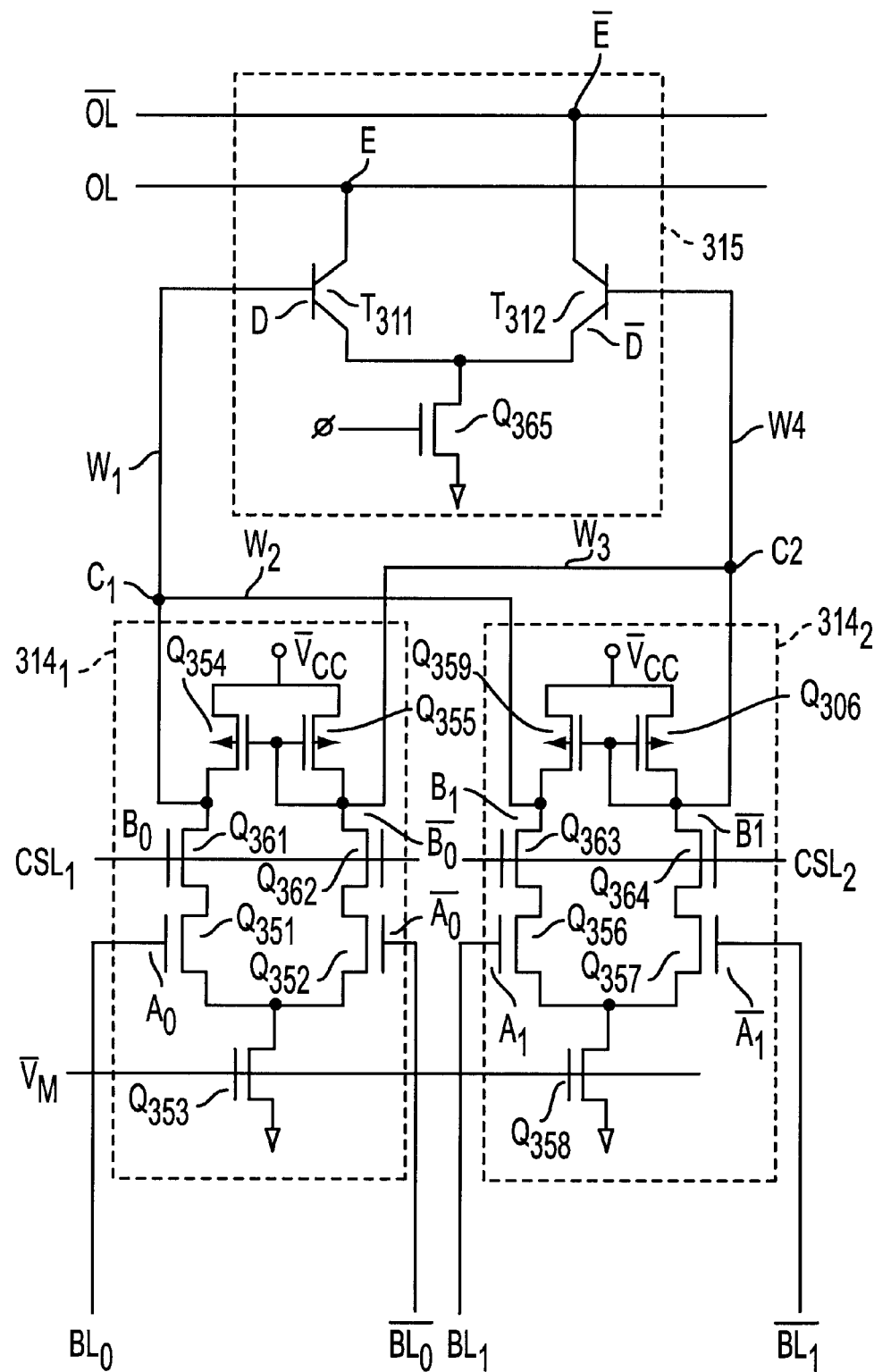
FIG. 21 is a circuit diagram of the CMOS differential amplifiers and the BICMOS differential amplifier in FIG. 17.

Each of the bit-line sense amplifiers is composed of a pair of CMOS differential amplifiers (first differential amplifiers) $314_1$, $314_2$, respectively connected to the bit-line pair BL, BL and a BICMOS differential amplifier (second differential amplifier) 315 connected to the output nodes of the CMOS differential amplifiers $314_1$, $314_2$. A BICMOS circuit is one which includes both bipolar and CMOS transistors. The BICMOS sense amplifiers 315 are respectively disposed in opposition to pairs of the bit lines BL, BL. The specific circuit constitution is shown in FIG. 21, as an example. The first CMOS differential amplifier $314_1$ comprises, as its basic elements, n channel MOS transistors $Q_{351}$ and $Q_{352}$ as drivers, an n channel MOS transistor $Q_{353}$ for current supply and p channel MOS transistors $Q_{354}$ and $Q_{355}$. The second CMOS differential amplifier $314_2$ is also comprised of n channel MOS transistor $Q_{356}$ and $Q_{357}$ as drivers, an n-channel MOS transistor $Q_{358}$ for current supply and p channel MOS transistors $Q_{359}$ and $Q_{360}$.

In the first CMOS differential amplifier $314_1$, sources of n channel MOS transistors $Q_{351}$ and $Q_{352}$ are commonly connected to the drain of n channel MOS transistor $Q_{353}$. To the source of MOS transistor $Q_{353}$, ground voltage Vss is supplied. The gates of the p channel MOS transistors $Q_{354}$ and $Q_{355}$ are connected to each other and also connected to one of the output nodes of the first CMOS differential amplifier, connected to the source of the p channel MOS transistor $Q_{355}$. A power supply voltage $V_{CC}$ is applied to the common drain of the p channel MOS transistors $Q_{354}$ and $Q_{355}$.

The same thing is true also in the second CMOS differential amplifier $314_2$.

Between the driver MOS transistors $Q_{351}$, $Q_{352}$ and the load MOS transistors $Q_{354}$, $Q_{355}$, a pair of switching n channel MOS transistors $Q_{361}$ and $Q_{362}$ are formed. Similarly, between the driver MOS transistors $Q_{356}$, $Q_{357}$ and load transistors $Q_{359}$, $Q_{360}$, a pair of switching n channel MOS transistors $Q_{363}$ and $Q_{364}$ are formed. The gates of the current supply MOS transistors $Q_{353}$ and $Q_{358}$ are connected to a common wiring, and a voltage $V_M$ of between $V_{CC}$ and $V_{SS}$, preferably is (½) $V_{CC}$ or below, is supplied. As seen in FIG. 21, two pairs of input nodes $A_0$, $\overline{A_0}$, $A_1$, and $\overline{A_1}$ are formed for two pairs of bit lines $BL_0$, $\overline{BL_0}$, $BL_1$, and $\overline{BL_1}$.

The gates of the switching MOS transistors $Q_{361}$ and $Q_{362}$ are commonly connected to a column select wiring $CSL_1$. On the other hand, the gates of the switching MOS transistors $Q_{363}$ and $Q_{364}$ are commonly connected to a column select wiring $CLS_2$.

The numerals $B_0$, $\overline{B_0}$, $B_1$, and $\overline{B_1}$ indicate output nodes of the CMOS differential amplifiers $314_1$ and $314_2$.

The CMOS differential amplifiers $314_1$ and $314_2$ are connected to the BICMOS differential amplifier with wirings $W_1$ to $W_4$ as shown in FIG. 21. And the connecting position of each wiring is indicated by numerals $C_1$, $C_2$.

The BICMOS differential amplifier 315 comprises driver npn transistors $T_{311}$ and $T_{312}$, in which collectors, which are output nodes E, E, are respectively connected to a pair of output data lines OL, OL and emitters are commonly connected there between, and to an activate n channel MOS transistor $Q_{365}$. A pair of output nodes $B_1$ and $B_2$ are respectively connected to the bases of the bipolar transistors $T_{301}$ and $T_{302}$, which constitute input terminals D, D. Accordingly., by commonly using one BICMOS differential amplifier 317 for two pairs of bit lines, an increase in the occupied area is prevented. Besides, the activate MOS transistors $Q_{365}$ is controlled with a clock φ.

Figure 22:
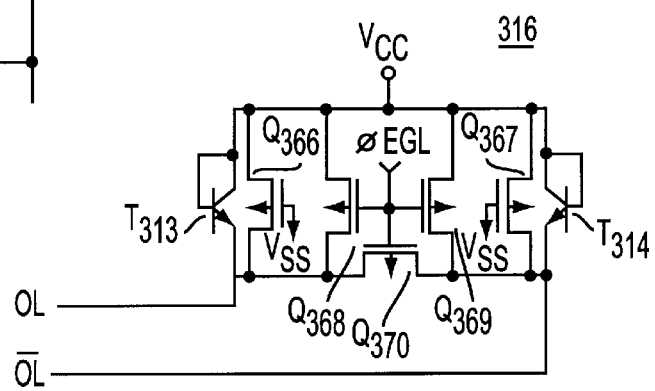
FIG. 22 is a circuit diagram of the load circuit in FIG. 17.

To the output data lines OL, OL, a common load circuit 316 is connected for a plurality of BICMOS differential amplifiers 315, as indicated in FIG. 17. The load circuit 316 is, for example, as shown in FIG. 22, comprised of diode-connected npn bipolar transistors $T_{313}$, $T_{314}$, and p channel MOS transistors $Q_{366}$, $Q_{367}$ parallel-connected thereto. These are the main parts of the load circuit 316. The npn transistors $T_{313}$ and $T_{314}$ are the loads for charging one of the output data lines OL, OL at high speed. The p channel MOS transistors $Q_{366}$, $Q_{367}$ are provided to raise to the "H" level one of the output data lines OL, OL to $V_{CC}$ in spite of decreasing potential caused by the base-emitter voltage $V_{BE}$ of the npn transistors $T_{313}$, $T_{314}$. The load circuit 316 further comprises precharge p channel MOS transistors $Q_{368}$, $Q_{369}$ for setting the output data lines OL, OL at $V_{CC}$ potential and a p channel MOS transistor $Q_{370}$ as an equalizer. These MOS transistors $Q_{368}$ to $Q_{370}$ are controlled with a clock $\phi_{EQL}$.

The operation of DRAM thus fabricated will now be described.

Figure 23:
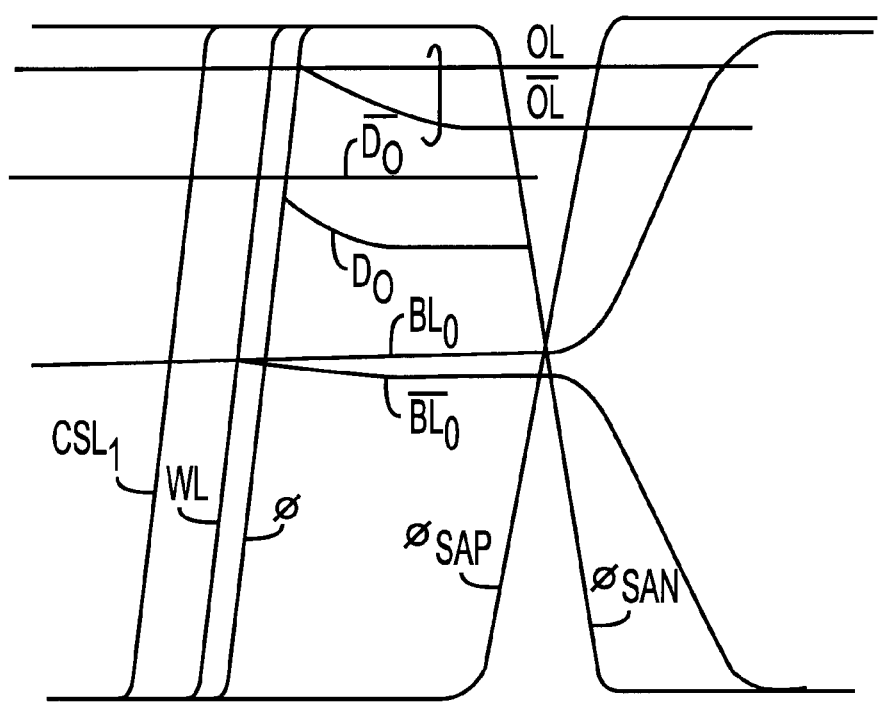
FIG. 23 is an illustration showing the potential of each part of the DRAM with respect to time.

Firstly, the information reading operation is as follows. FIG. 23 shows the potentials of each part with respect to time.

When one of the work lines WL ($WL_0$, $WL_1$ - - - ), which is selected according to row addresses, is driven, the information of the memory cells thus selected arises on one of the bit lines BL or BL in each bit-line pair. The bit lines BL, $\overline{BL}$ ($BL_0$, $\overline{BL_0}$, $BL_1$, $\overline{BL_1}$, - - - , $BL_n$, $\overline{BL_n}$) are previously precharged, for instance, at one half (½) the $V_{CC}$ level. Now, an assumption is made that the column select the signal lines are $CSL_1$="H", $CSL_2$, - - - ="L" respectively. In this instance, the CMOS differential amplifier $314_1$ connected to bit lines $BL_0$, $\overline{BL_0}$ acts as the amplifier. The CMOS differential amplifier $314_2$ does not act because the switching MOS transistors $Q_{363}$ and $Q_{364}$ are off. Therefore, the information on $BL_0$, $\overline{BL_0}$ is read out to the output nodes $B_0$, $\overline{B_0}$ through first CMOS differential amplifier $314_1$. Then, by means of the BICMOS differential amplifier 315 activated with the clock φ, the information is read out to output lines OL, OL.

In the instance described, as for the un-selected CMOS differential amplifier $314_2$, its two output nodes are completely separated from the output nodes of differential amplifier $314_1$ by switching MOS transistors $Q_{363}$ and $Q_{364}$, even though there is a period that both of the driver MOS transistors $Q_{356}$ and $Q_{357}$ are nearly turned on. In other words, data interference between the output nodes $B_0$, $\bar{B}_0$, $B_1$ and $\bar{B}_1$ does not occur. Further, because of the switching MOS transistors $Q_{363}$ and $Q_{364}$, the degree of parasitic capacitance between crates of the driver MOS transistors $Q_{356}$, $Q_{357}$ and the output nodes $B_1$, $B_2$ becomes considerably small, so that the addition of noise is prevented.

Then, activate signals $\phi_{SAN}$, $\phi_{SAP}$ are supplied to the CMOS flip-flop 312. Therefore, all the information on bit lines BL, $\overline{BL}$, ($BL_0$, $\overline{BL}_0$, $BL_1$, $\overline{BL}_1$, - - - , $BL_n$, $\overline{BL}_n$) is amplified at the same time. Then, the information amplified to the original levels is restored in the memory cells 311 by turning off the word line WL. Thus, the active-restoring is completed.

The information write operation is as follows:

When one of the word lines WL is selected, the information of the selected memory cells arises on one bit line BL or $\overline{BL}$ in each bit-line pair. After that, an input circuit 313 selected by a column address is opened, and the information to be written is input from the input data lines IL, $\overline{IL}$. Then, the voltage supply clocks $\phi_{SAN}$, $\phi_{SAP}$ of the CMOS flip-flops are activated. In this manner, the information is written to a memory cell 311.

According to the foregoing embodiment, mutual interference of read out data can be prevented. Further, noise which arises on the output nodes is prevented. Therefore, readout errors are enormously reduced.

Figure 24:
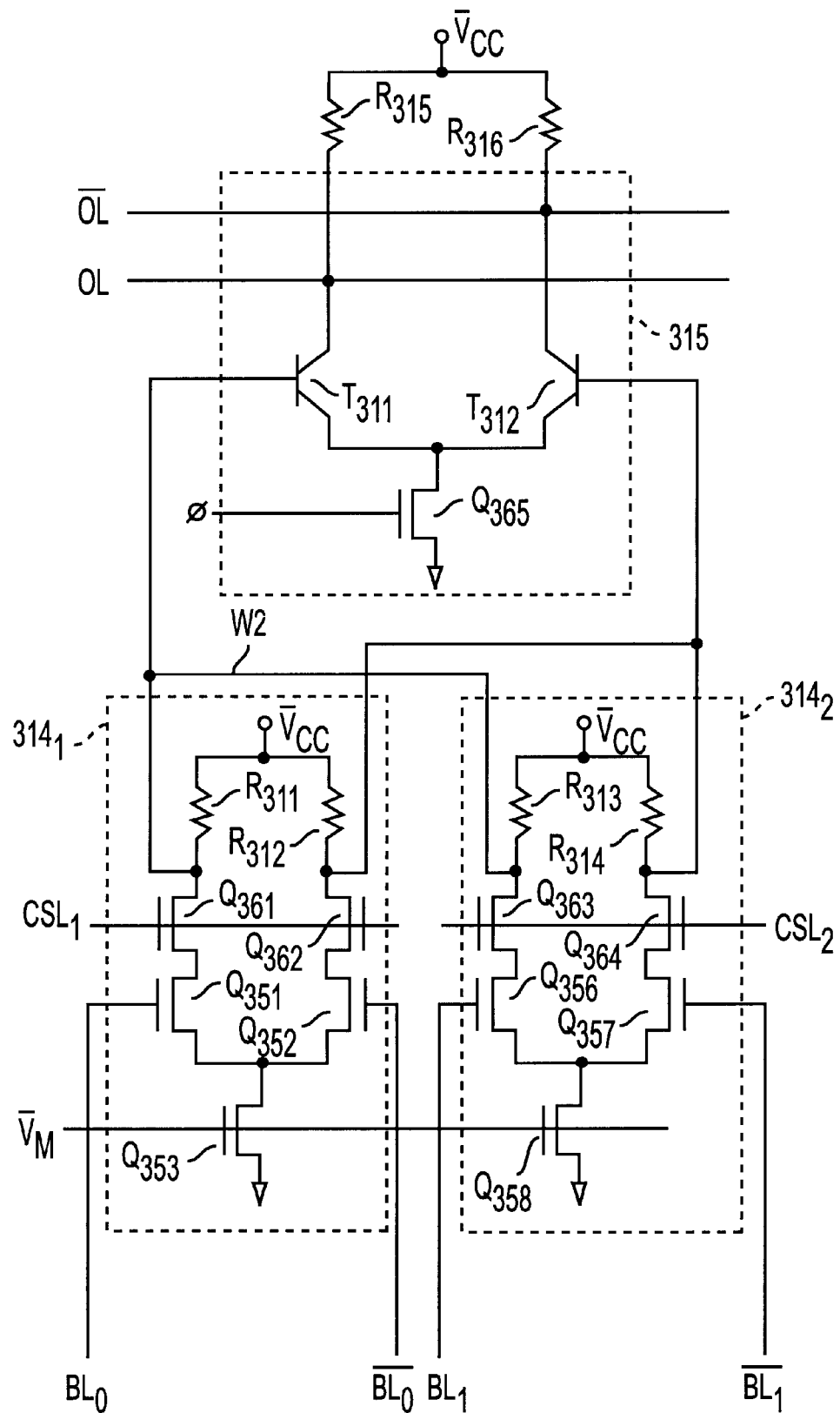
FIG. 24 through FIG. 26 are circuit diagrams of other embodiments of the present invention.

FIG. 24 is a circuit diagram of another embodiment of the present invention, and shows a construction of a bit-line sense amplifier. In FIG. 24, like reference numerals are used for designing like or equivalent portions in FIG. 21.

In this embodiment, resistors $R_{311}$ to $R_{314}$ are used as loads in the CMOS differential amplifiers $314_1$ and $314_2$. Similarly, resistors $R_{315}$ and $R_{316}$ are adopted as the loads of the BIMOS differential amplifier 315.

Figure 25:
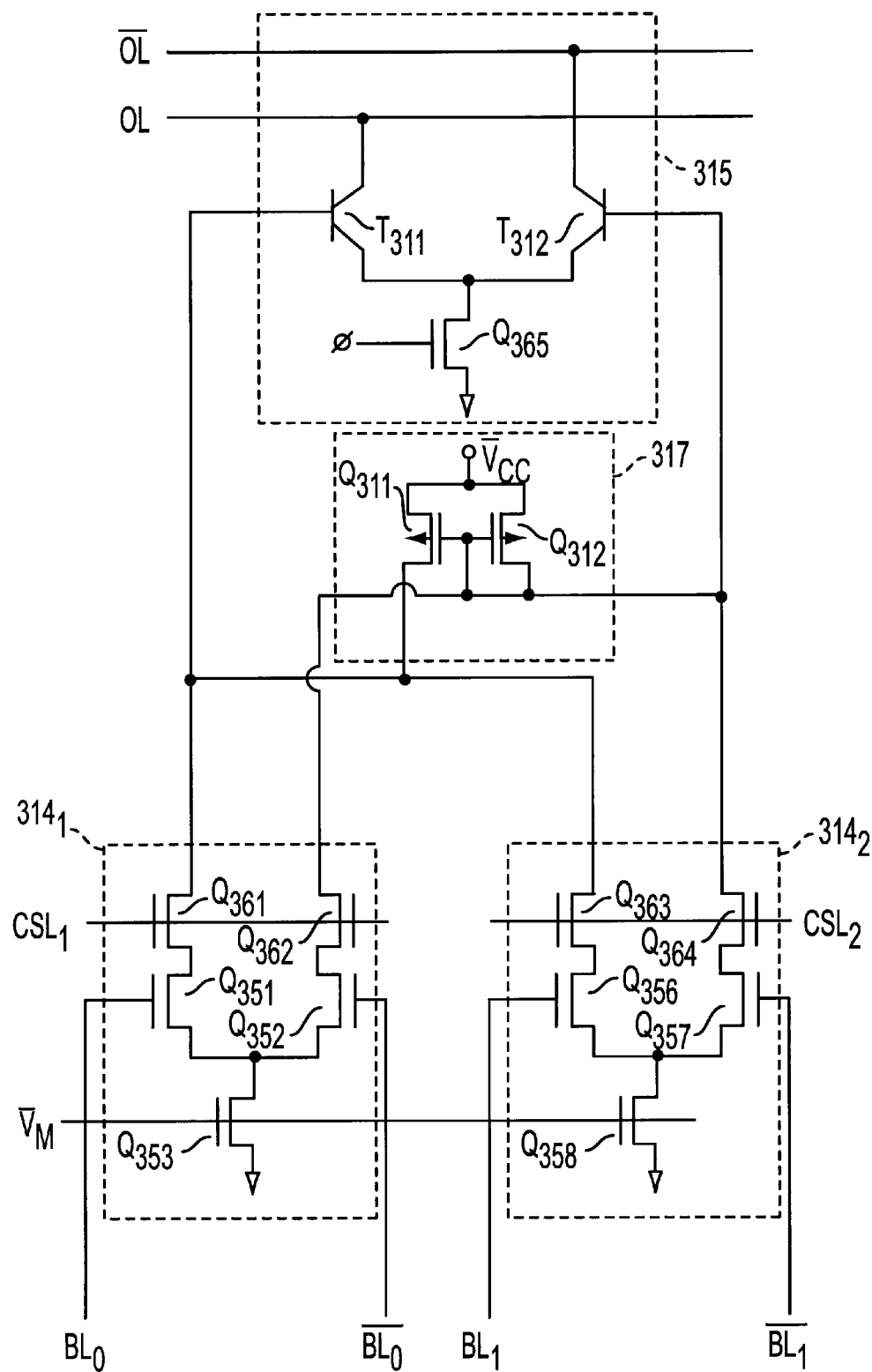

FIG. 25 is a circuit diagram of another embodiment of the present invention.

In this embodiment, the loads of the first and second CMOS differential amplifiers $34_1$ and $34_2$ are made in common.

The load circuit 317 comprises p channel MOS transistors $Q_{371}$ and $Q_{372}$. Instead of p channel MOS transistors $Q_{371}$ and $Q_{372}$, resistors as shown in FIG. 24 may be used.

Figure 26:
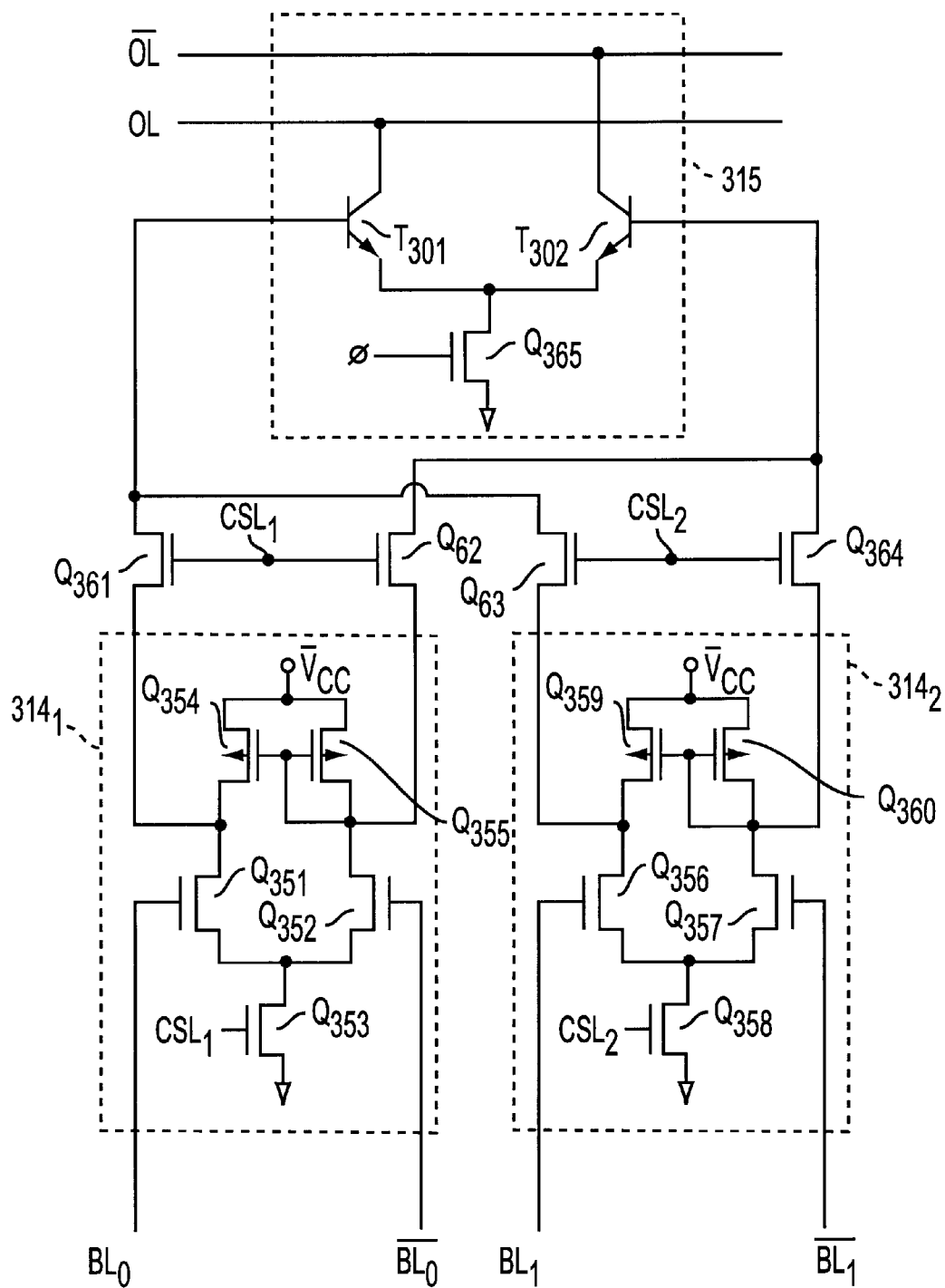

FIG. 26 is a circuit diagram of another embodiment of the present invention.

In this embodiment, the pair of switching n channel MOS transistors $Q_{361}$ and $Q_{362}$ are inserted in wirings which connect the output nodes of the CMOS differential amplifier $314_1$ to the BICMOS differential amplifier 315. Similarly, switching n channel MOS transistors $Q_{363}$ and $Q_{364}$ are inserted in wirings which connect the output nodes of the CMOS differential amplifier $314_2$ to the BICMOS differential amplifier 315.

Although the invention has been described with reference to specific embodiments, it shall be understood by those skilled in the art that numerous modifications may be made that the within the spirit and scope of the inventive contribution.

For example, CMOS current mirror circuit 200 and BICMOS differential amplifier circuit 202, both used in the fourth embodiment shown in FIG. 6, have only one activating MOSFET each. That is, circuit 200 has activating MOSFET Q84, and circuit 202 has enabling MOSFET Q96. These activating MOSFETs can be replaced by an enabling unit made of two parallel-connected two MOSFETs, as in the third embodiment shown in FIG. 3. In this case, the parallel-connected activating MOSFETs are rendered conductive by a column-address signal, thereby to activate a selected pair of bit lines.

Moreover, transfer gates can be provided on lines 254 and 256 which connect MOS differential amplifier circuit 250 and BICMOS differential amplifier circuit 258, in the fifth embodiment shown in FIGS. 10 and 11. In this case, too, BICMOS differential amplifier circuit 258 is connected to a desired pair of bit lines by a column-address line.

Furthermore, the CMOS flip flops 312 may be other types of MOS amplifiers, the CMOS differential amplifier may be other types of MOS differential amplifiers, and the BIMOS differential amplifier is not restricted to the type described.

As for the position in which the switching MOS transistor is inserted, it may be in the current pass between each connecting position of the wirings, respectively belonging to different MOS differential amplifiers and each of the driver MOS transistors.

What is claimed is:

1. A dynamic semiconductor memory comprising:

parallel word lines provided on a substrate;

parallel bit lines provided on the substrate to insulatively cross with said word lines, said bit lines including a bit-line pair having a first bit line and a second bit line;

memory cells connected to crossing points of said word lines and said bit lines, said memory cells comprising voltage-controlled unipolar transistors and capacitors; and sense amplifier means connected to said bit-line pair, for sensing and amplifying a difference between potentials on said first and second bit lines when a memory cell connected to said bit-line pair is selected from among the memory cells in a data readout mode, said sense amplifier means comprising a BIMOS differential amplifier circuit having a voltage-controlled unipolar transistor and current-controlled bipolar transistors functioning as driver elements and each of which have a base electrode;

said sense amplifier means further comprising a CMOS current mirror circuit connected to said first and second bit lines and said base electrodes of said current-controlled bipolar transistors.

2. A dynamic random access memory device, comprising:

a plurality of word lines formed on a substrate;

a plurality of bit-line pairs formed on said substrate;

memory cells connected to said word lines and said bit lines, each of said memory cells comprising a transistor and a capacitor;

a plurality of MOS differential amplifiers respectively having a pair of input nodes and including a pair of driver MOS transistors having outputs, the gates of said driver MOS transistors constituting said input nodes and being connected to said bit-line pairs;

a BIMOS amplifier having a pair of input nodes and a pair of output nodes and including a pair of driver bipolar transistors, the bases of said bipolar transistors constituting said pair of input nodes; and a plurality of switching means for selectively connecting the output of said driver transistors to said input nodes of said BIMOS amplifier.

3. A dynamic random access memory device according to claim 2, further including a plurality of MOS amplifiers respectively connected between said bit-line pairs, said MOS amplifiers respectively amplifying data read out on said bit-line pairs for restoring said read out data into said memory cells, simultaneously for all said bit-line pairs.

4. A dynamic random access memory device according to claim 2, wherein each of said MOS differential amplifiers is a CMOS current mirror type.

5. A dynamic random access memory device according to claim 2, wherein said MOS differential amplifiers having respective supply MOS transistors with gates that are commonly connected and supplied with a voltage between a power supply voltage and ground potential.

6. A dynamic random access memory device according to claim 2, wherein each said MOS differential amplifier has two switching means and said each switching means is an MOS transistor having a gate connected in common with a gate of the other switching means MOS transistor of the same MOS differential amplifier.

7. A dynamic random access memory device according to claim 2, wherein said BIMOS amplifier is a BICMOS differential amplifier.

8. A dynamic random access memory device according to claim 2, wherein each of said MOS differential amplifier has a load which is formed commonly between a plurality of said MOS differential amplifier.

9. A dynamic random access memory device according to claim 2 including means providing a load connected from a power source to each MOS transistor at a connection point and said switching means are further MOS means and connected respectively between said connection points and said input nodes of said BIMOS amplifier.

10. A dynamic random access memory device according to claim 3, wherein said MOS amplifier is a CMOS flip flop.

11. A dynamic random access memory device according to claim 2, wherein said bit-line pairs are precharged to a level higher than ground potential.

12. A random access memory device according to claim 2, wherein said bit-line pairs are precharged to a middle voltage between supply voltage and ground potential.

13. A dynamic random access memory device according to claim 2, including means providing a load connected from a power source and each said switching means comprises a further MOS transistor connected between said load means and one of said driver MOS transistors.

14. A dynamic random access memory device, comprising:

a plurality of word lines formed on a substrate;

a plurality of bit-line pairs formed on said substrate, crossing said plurality of word lines;

memory cells connected to the crossing section of said word lines and said bit lines, each of said memory cells comprises a MOS transistors and a capacitor;

a plurality of MOS differential amplifiers respectively having a pair of input nodes and including a pair of driver MOS transistors having output, the gates of said driver MOS transistors constituting said input nodes and connected respectively to said bit-lines pairs, said MOS differential amplifiers respectively having a current supply MOS transistor, the gates of said current supply MOS transistors in each MOS differential amplifier are commonly connected and supplied a fixed potential;

a BIMOS amplifier having a pair of input nodes and a pair of output nodes and including a pair of driver bipolar transistors, the bases of said bipolar transistors constituting said input nodes;

a plurality of switching means, each said switching means being connected in a current path between one of said driver MOS transistor outputs and one of said BIMOS amplifiers input nodes, said switching means being controlled by column select signals;

a plurality of MOS flip-flops respectively connected between said bit-line pairs, to simultaneously amplify data read out on said bit-line pairs for restoring said read out data into said memory cells; and a pair of output lines connected to said pair of output nodes of said BIMOS amplifier.

15. In a dynamic random access memory device, a first pair of precharged bit lines;

a first buffer differential amplifier having inputs connected to said first pair of bit lines and having first and second outputs;

a second pair of precharged bit lines;

a second buffer differential amplifier having inputs connected to said second pair of bit lines and having third and fourth outputs, said third output being connected in common with said first output to a first output line, said fourth outputs being connected in common with said second output to a second output line;

means for selectively preventing communication between said first and second output lines through said buffer differential amplifiers.

\* \* \* \* \*